US007066318B2

(12) United States Patent
Kato

(10) Patent No.: US 7,066,318 B2
(45) Date of Patent: Jun. 27, 2006

(54) TRANSPORTING APPARATUS

(75) Inventor: Heizaburo Kato, Shizuoka (JP)

(73) Assignee: Sankyo Manufacturing Co., Ltd., Tokyo (JP)

(*) Notice: Subject to any disclaimer, the term of this patent is extended or adjusted under 35 U.S.C. 154(b) by 0 days.

(21) Appl. No.: 11/116,121

(22) Filed: Apr. 27, 2005

(65) Prior Publication Data

US 2006/0021853 A1 Feb. 2, 2006

Related U.S. Application Data

(63) Continuation of application No. 10/185,204, filed on Jun. 28, 2002, now abandoned.

(30) Foreign Application Priority Data

| | | |
|---|---|---|
| Aug. 3, 2001 | (JP) | 2001-236917 |
| Aug. 3, 2001 | (JP) | 2001-236918 |
| Aug. 3, 2001 | (JP) | 2001-236919 |

(51) Int. Cl.
*B65G 29/00* (2006.01)

(52) U.S. Cl. .............................. 198/465.1; 198/343.1; 104/49; 104/163

(58) Field of Classification Search ............ 198/465.1, 198/465.2, 343.1, 467.1; 104/49, 100, 162, 104/163, 166

See application file for complete search history.

(56) References Cited

U.S. PATENT DOCUMENTS

| | | | |
|---|---|---|---|
| 166,976 A | 8/1875 | Eppelsheimer | 104/49 |
| 363,144 A | 5/1887 | Burton | 104/49 |
| 2,789,683 A | 4/1957 | Stahl | 198/465.2 |
| 3,478,859 A | 11/1969 | Kempel et al. | 198/465.1 |
| 3,858,626 A | 1/1975 | Ribordy | 104/166 |
| 3,866,537 A | 2/1975 | Minkwitz | 104/163 |
| 5,590,756 A | 1/1997 | Zaguroli, Jr. | 104/163 |
| 6,073,553 A | 6/2000 | Tweedy et al. | |
| 6,148,721 A | 11/2000 | Hellmeier et al. | |

FOREIGN PATENT DOCUMENTS

| | | |
|---|---|---|
| EP | 0 010 131 A | 4/1980 |
| EP | 0 995 700 A | 4/2000 |
| GB | 1 032 546 A | 6/1966 |
| JP | 07-204965 A | 8/1995 |
| JP | 2000-168933 | 6/2000 |

*Primary Examiner*—James R. Bidwell
(74) *Attorney, Agent, or Firm*—Harness, Dickey & Pierce, P.L.C.

(57) ABSTRACT

A transporting apparatus permits to intermittent indexing with freely and independently setting stop position of work tables and stopping period adapting to each individual work station. The transporting apparatus sequentially transports a work table across a plurality of work stations. The transporting apparatus has a linear transporting path linearly connecting a plurality of work stations and guiding linear motion of the work table, a cylindrical cam engaging with a contactor provided on the work table for driving the work table for linear motion, and the cylindrical cam having a stopping zone formed corresponding to each position of the work station and having no axial displacement relating to cam rotation angle and a transporting zone formed corresponding to a position between the work station and having an axial displacement relative to cam rotation angle.

4 Claims, 25 Drawing Sheets

OVAL TRACK

RECTANGULAR

TRIANGULAR

OVAL TRACK WITH INTERMEDIATE STOPS

TRANSPORTING APPARATUS

CROSS REFERENCE TO RELATED APPLICATIONS

This Application is a continuation of U.S. patent application No. Ser. 10/185,204 filed on Jun. 28, 2002 now abandoned. This application also claims the benefit of Japanese Patent Application No. 2001-236,917 filed Aug. 3, 2001, Japanese Patent Application No. 2001-236,918 filed Aug. 3, 2001 and Japanese Patent Application No. 2001-236,919 filed Aug. 3, 2001. The disclosure of the above applications is incorporated herein by reference.

BACKGROUND OF THE INVENTION

1. Field of the Invention

The present invention relates to a transporting apparatus including a plurality of mutually independent work tables mounting and holding works moving across individual work stations and intermittently moving respective tables depending upon work timing.

2. Related Art

In various automated machine, such as automatic assembly machine, inspection machine of products, mounting machine for mounting chip or the line on a circuit board, and so forth, work or product is transported up to a predetermined work station for performing assembling or inspection operation by robot or the like. In this case, operation is performed in a condition where work or product is stopped in each work station. Transportation of individual work and product has to be performed intermittently so as to repeat moving and stopping in consideration of operation periods in respective work stations.

Therefore, in the prior art, as shown in FIGS. 27 and 28, transporting apparatus 2, 2*a* employing indexing devices 1 converting constant input rotation into intermittent rotation. In the transporting apparatus 2 shown in FIG. 27, a main sprocket 4 is rigidly secured on an output shaft 3 of the indexing device 1 employing a cam. A chain 5 is wrapped around the main sprocket 4 and a sub sprocket 4*a* arranged with a given distance to the main sprocket. On the chain 5, a plurality of tables 6 are provided with a predetermined pitch. In this case, the main sprocket 4 and the sub sprocket 4*a* are rotatable about horizontal shafts. The tables 6 are arranged horizontally between both sprockets 4 and 4*a*.

On the other hand, the transporting apparatus 2*a* of FIG. 28 has similar construction to the foregoing transporting apparatus 2. In this case, not shown main sprocket and sub sprocket are rotated about vertical shafts, and tables 6 are arranged vertically.

Then, in either transporting apparatus 2 and 2*a*, works 7 are mounted or held on respective tables 6 to carry intermittently. The tables 6 are stopped at positions of not shown work stations arranged on sides of a transporting path of the tables 6 for a predetermined period from time to time. During stopping period, desired operations are performed at respective work stations.

In such conventional transporting apparatus 2 and 2*a*, in which intermittent indexing is performed, upon moving the tables by output rotation of an indexing device 1, the chain 5 is driven by the sprocket 4 provided on the output shaft 3 of the indexing device 1. For this purpose, positioning accuracy of the table at the work station, in other words, motion accuracy of the table is influenced by a positioning accuracy of the indexing device 1, mounting accuracy of sprocket 4, accuracy of teeth pitch of the sprocket 4, and accuracy of link length of the chain 5. Namely, between the indexing device 1 and the table 6, there are lots of portions requiring high precision, in other words, there are lots of portions causing dimensional errors, to accumulate dimensional errors to degrade motion accuracy or positioning accuracy of the table. On the other hand, wearing can be caused in the portions required accuracy. Cumulative wearing in various portions should results in secular change to increase error to degrade motion accuracy or positioning accuracy of the table even in this viewpoint. Therefore, a transporting length of the transporting apparatus is limited and is difficult to extend, Furthermore, operation timing in stopping and moving the tables 6, is determined uniformly by intermittent rotation as converted by the indexing device 1 since the tables are fixedly mounted on the chain moving following to output rotation of the indexing device 1. Accordingly, all of tables 6 are driven in uniform timing and uniform motion magnitude with no freedom in determining timing for each individual table.

For the reason set forth above, and despite of the fact that work space of working machines, such as robots or the like provided in respective work stations are variable to be large and small, the work stations have to be arranged with uniform interval adapting to the working machine requiring the largest work space to lower space efficiency. On the other hand, the operation periods in respective work stations are variable to be long and short. Despite of this fact, the stopping period in intermittent transporting operation has to be set adapting to the operation period of the work station requiring the longest operation period to cause waste waiting period in the work station finishing the operation in shorter period. Furthermore, it is difficult to feed large kinds of works 7 or products in the transporting apparatus 2 and 2*a*. Also, it is difficult to improve operation efficiency.

Even upon transfer of work between former step or next state capable of use of common work table and the linear transporting apparatus, it is not possible to transfer the work together with the work table holding the former to require a separate work transfer device. By providing such separate work transfer device, large installation space can be occupied to lower space efficiency to require substantially high cost.

SUMMARY OF THE INVENTION

The present invention has been worked out in view of the shortcoming in the prior art set forth above. Therefore, it is an object of the present invention to provide a transporting apparatus which permits to intermittent indexing with freely and independently setting stop position of work tables and stopping period adapting to each individual work station for improving space efficiency and work efficiency and conjunction therewith for improving motion accuracy and/or positioning accuracy of each work table, to easily construct compact transporting paths in various manner with large freedom with arranging large number of work stations in alignment.

Another object of the present invention is to provide a transporting apparatus which can significantly improve motion accuracy and positioning accuracy of each work table and permits arranging possible large number of work stations in alignment.

A further object of the present invention is to provide a transporting apparatus which can transfer work together with the work table holding the former between a former step and a next step which can use common work table to achieve superior motion accuracy and positioning accuracy to make it difficult to increase error due to secular change by wearing or so forth, and to easily construct compact transporting paths in various manners with large freedom.

In order to accomplish the above-mentioned and other objects, according to one aspect of the present invention, a transporting apparatus sequentially transporting a work table across a plurality of work stations, comprises:

a linear transporting path linearly connecting a plurality of work stations and guiding linear motion of the work table;

a cylindrical cam engaging with a contactor provided on the work table for driving the work table for linear motion, the cylindrical cam having a stopping zone formed corresponding to each position of the work station and having no axial displacement relating to cam rotation angle and a transporting zone formed corresponding to a position between the work station and having an axial displacement relative to cam rotation angle.

The linear transporting path may be constructed with a support base integrally formed with an apparatus housing and slidably mounting the work table and a guide member provided on the support base in linear shape, and the work table may be provided with a slider engaging with the guide member and permitting linear movement of the work table with restricting pivotal motion thereof.

According to another aspect of the present invention, a transporting apparatus sequentially transporting a work table across a plurality of work stations, comprising:

a linear transporting mechanism including a linear transporting path linearly extending across the plurality of work stations and having guide means for linearly transporting the work table;

two cylindrical cams provided along the linear transporting path arranged in alignment with each other and engaging with contactor extended from the work table for driving the work table linearly;

transfer means provided between the cylindrical cams and engaging with engaging means provided in the work table for transferring the work table reaching a transportation termination end of one cylindrical cam arranged upstream side in transporting direction to a transportation starting end of the other cylindrical cam arranged downstream side in transporting direction; and synchronous actuation device provided between both cylindrical cams for synchronously transmitting rotary torque to the transferring means and the cylindrical cam.

The transporting apparatus may further comprise pivotal transporting mechanism, in which at least one of the transportation starting end and the transportation terminating end of the linear transporting mechanism is provided with a pivotal arm mounted on an output shaft performing extracting and retracting operation in axial direction and rotational motion about an axis, the pivotal arm engages with the work table by extracting motion of the output shaft and pivotally transporting the work table engaging with the pivotal arm by operational motion of the output shaft, the pivotal transporting mechanism is synchronously operated with the cylindrical cam of the linear transporting mechanism for transferring the work table between the pivotal transporting mechanism and the linear transporting mechanism.

According to yet another aspect of the present invention, a transporting apparatus sequentially transporting work table across a plurality of work stations, comprises:

a plurality of linear transporting mechanism, each including a linear transporting path extending linearly across a plurality of work stations and having guide means releasably engaging with a work table for guiding the latter for linear motion;

two cylindrical cams provided along the linear transporting path in alignment and releasably engaging with a contactor extended from the work station in the same direction as engaging and disengaging direction of the guide means for driving the work table to move linearly, transfer means provided between the cylindrical cams and engaging with engaging means provided in the work table for transferring the work table reaching a transportation termination end of one cylindrical cam arranged upstream side in transporting direction to a transportation starting end of the other cylindrical cam arranged downstream side in transporting direction; and synchronous actuation device provided between both cylindrical cams for synchronously transmitting rotary torque to the transferring means and the cylindrical cam;

each of the linear transporting mechanisms having transportation terminating end and transportation starting end, the linear transporting mechanisms being sequentially arranged with placing the transportation terminating end of one linear transporting mechanism in close proximity with the transportation starting end of the other linear transporting mechanism with a predetermined angle;

a pivotal transporting mechanism each located between the adjacent transportation terminating end of one linear transporting mechanism and transportation starting end of the other linear transporting mechanism having an output shaft located with equal distance to the adjacent transportation terminating end and transportation starting end, having a pivotal arm mounted on the output shaft for engaging with the work table stopped at the transportation terminating end of one linear transporting mechanism by extracting motion of the output shaft in axial direction and transferring the work table to the transportation starting end of the other linear transporting mechanism by rotational motion of the output shaft, and disengaging from the work table by retracting motion of the output shaft, the plurality of linear transporting mechanism and the pivotal transporting mechanism being operated in synchronism with each other.

The cylindrical cam may define stopping zones corresponding to a transportation terminating end, a transportation starting end and each work station and having no axial displacement relative to cam rotational angle and transporting zones located at positions between the work stations and having axial displacement relative to cam rotational angle.

The engaging member may be formed with a pin extended from, the work table, and the transferring means may be formed with a sprocket.

According to further aspect of the present invention, a transporting apparatus comprises:

a linear transporting mechanism driving a work table engaging with guide means of a transporting path formed into linear shape along the guide means by means of a cylindrical cam; and a pivotal transporting mechanism having a pivotal arm mounted on an output shaft which performs extracting and retracting motion in axial direction and rotating motion about an axis, the pivotal arm being engaged and disengaged to and from the work table according to extracting and retracting motion of the output shaft, and pivotally transporting the work table engaging with the pivotal arm according to rotating motion of the output shaft, the pivotal transporting mechanism being provided at a transportation terminating end or a transportation starting end of the linear transporting mechanism and being actuated in synchronism with the cylindrical cam of the linear transporting mechanism for transferring the work table between the pivotal transporting mechanism and the linear transporting mechanism.

According to yet further aspect of the present invention, a transporting apparatus comprises:

a plurality of linear transporting mechanism, each including a linear transporting path extending linearly across a plurality of work stations and having guide means releasably engaging with a work table for guiding the latter for linear motion;

a cylindrical cam provided along the linear transporting path and releasably engaging with a contactor extended from the work station in the same direction as engaging and disengaging direction of the guide means for driving the work table to move linearly, the cylindrical cam defining stopping zones corresponding to a transportation terminating end, a transportation starting end and each work station and having no axial displacement relative to cam rotational angle and transporting zones located at positions between the work stations and having axial displacement relative to cam rotational angle;

each of the linear transporting mechanisms having transportation terminating end and transportation starting end, the linear transporting mechanisms being sequentially arranged with placing the transportation terminating end of one linear transporting mechanism in close proximity with the transportation starting end of the other linear transporting mechanism with a predetermined angle;

a pivotal transporting mechanism each located between the adjacent transportation terminating end of one linear transporting mechanism and transportation starting end of the other linear transporting mechanism having an output shaft located with equal distance to the adjacent transportation terminating end and transportation starting end, having a pivotal arm mounted on the output shaft for engaging with the work table stopped at the transportation terminating end of one linear transporting mechanism by extracting motion of the output shaft in axial direction and transferring the work table to the transportation starting end of the other linear transporting mechanism by rotational motion of the output shaft, and disengaging from the work table by retracting motion of the output shaft, the plurality of linear transporting mechanism and the pivotal transporting mechanism being operated in synchronism with each other.

The linear transporting path may be constructed with a support base integrally formed with an apparatus housing and slidably mounting the work table and a guide member provided on the support base in linear shape, and the work table may be provided with a slider engaging with the guide member and permitting linear movement of the work table with restricting pivotal motion thereof.

At least two linear transporting mechanisms and corresponding number of pivotal transporting mechanisms may be provided for forming an endless circulating transporting path.

BRIEF DESCRIPTION OF THE DRAWINGS

The present invention will be understood more fully from the detailed description given hereinafter and from the accompanying drawings of the preferred embodiment of the present invention, which, however, should not be taken to be limitative to the invention, but are for explanation and understanding only.

In the drawings.

DESCRIPTION OF THE PREFERRED EMBODIMENTS

Figure 1:
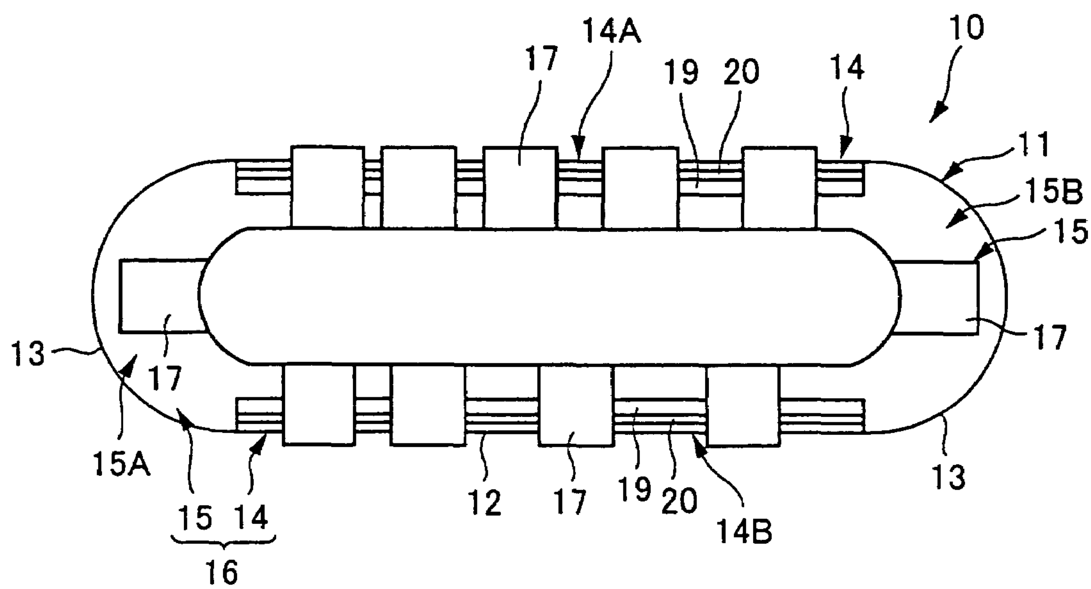
FIG. 1 is an external plan view showing overall construction of one embodiment of a transporting apparatus according to the present invention.
Figure 2:
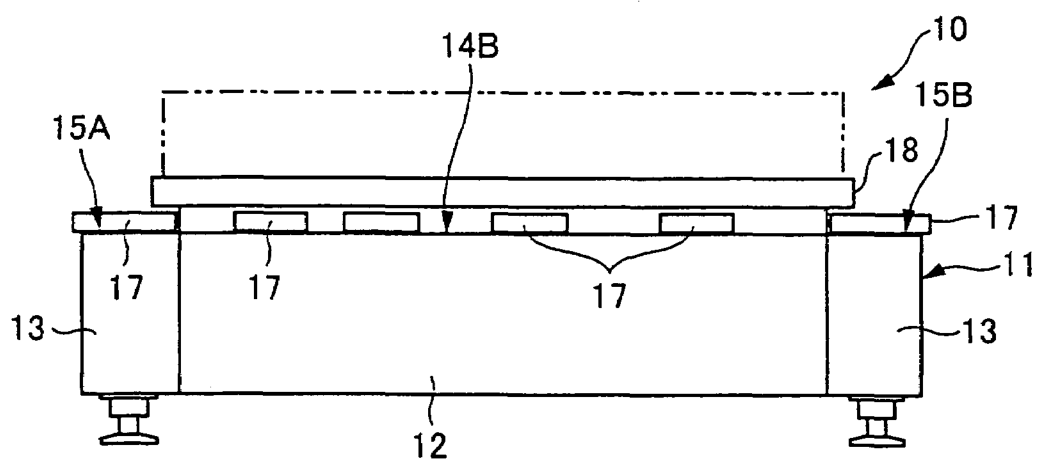
FIG. 2 is an external front elevation of the overall transporting apparatus of FIG. 1.
Figure 3:
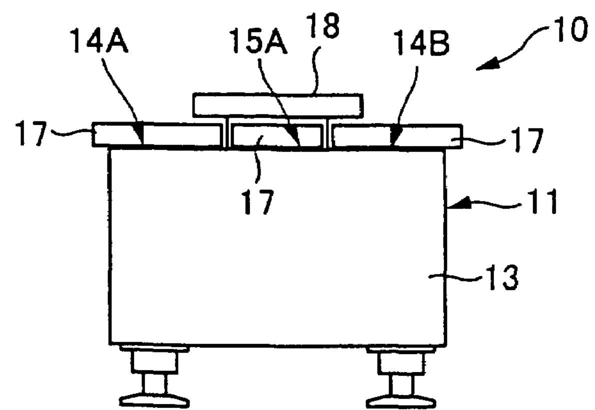
FIG. 3 is an external side view of the transporting apparatus of FIG. 1.

The present invention will be discussed hereinafter in detail in terms of the preferred embodiments of a transporting apparatus according to the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structure are not shown in detail in order to avoid unnecessary obscurity of the present invention.

As shown in FIGS. 1 to 6, one embodiment of a transporting apparatus 10 according to the present invention defines an oval shape outer circumference of a main body 11 in plan view with an upper end opened hollow rectangular parallelepiped shape housing 12 and semi-circular cover plates 13 covering both longitudinal end portions of the housing 12. On the upper surface of the main body 11, an oval track form endless circulating transportation path 16 consisted of two linear transporting paths 14A and 14B which will be generally identified by reference numeral 14 and two curved transporting paths 15A and 15B which will be generally identified by reference numeral 15. On the circulating transportation path 16, a plurality of work tables 17 are arranged. The work tables 17 are designed to circulate on the transportation path 16 with repeating movement and stopping at respective desired positions. Each stopping position where the worktable 17 is stopped temporarily, is set as work station for performing necessary processing operation for a work on the work table. At each work station, various operations, such as working, assembling or inspection for the work or a product are performed by various working machine unit, such as an operation robot mounted on a mounting base 18 provided at a center position of the upper surface of the housing 12.

On upper end portions of two longer wall portions 12*a* arranged in opposition along a longitudinal direction of the housing, support bases 19 having flat upper surface projected inwardly over entire length, are formed integrally. A plurality of work tables 17 are supported on the support bases 19 for linear sliding movement in the longitudinal direction. On the support bases 19, guide grooves 20 serving as guide members of guide means for guiding linear movement of the work tables 17, are formed. With the support bases 19 and the guide grooves 20, linear transporting paths 14 (14A and 14B) for linearly moving the work tables 17, are formed. Thus, two linear transporting paths 14A and 14B are defined on both sides of the common housing 12 of rectangular parallelepiped shape, adjacent with each other in parallel relationship.

On the other hand, within the housing 12, cylindrical cams 22A and 22B are provided and serve as linear transporting mechanisms 21A and 21B which generally identified by reference numeral 21, for driving the work tables 17 to move along two linear transporting paths 14A and 14B. Respective cylindrical cams 22A and 22B have axes extending in parallel to the guide grooves of the linear transporting paths 14A and 14B. Both ends of the cylindrical cams 22A and 22Bare rotatably supported on shorter wall portions 12*b* via bearings 23. The cylindrical cams 22A and 22B are located along lower portions of the linear transporting paths 14A and 14B. Namely, with the linear transporting paths 14 (14A and 14B) and the cylindrical cams 22 (22A and 22B), the linear transporting mechanism 21A and 21B which are generally identified by reference numeral 21 is formed.

The work table 17 is generally rectangular flat plate shape. On the lower surface of the work table, a slider 24 is provided to serve as guide means for slidably engaging with the guide groove 20 for restricting horizontal pivot motion and offset in lateral to the transporting direction and for guiding linear motion. In the shown embodiment, the slider 24 is constructed with a pair of engaging pins 24*a* provided in spaced apart relationship in transporting or longitudinal direction. On the other hand, on the lower surface of the work table 17, cam follower 26 is downwardly projected at a position inside of the linear transporting paths 14A and 14B and located on the axis of the cylindrical cam 22 so as to serve as contact with a cam groove 25 formed as cam portion in the cylindrical cam.

Each of the cylindrical cams 22A and 22B has one cam groove 25 extending in spiral fashion on the outer peripheral surface. As can be seen from the developed illustration in FIG. 7, the cam profile is consisted of stopping zones 25*a* set at positions corresponding to position of respective work stations and not provided displacement in axial direction over respectively predetermined cam angular displacement range, and transporting zones 25*b* set at positions corresponding to zones between the work stations and provided displacement in axial direction corresponding to cam angular displacement range.

It should be noted that, in the shown embodiment, the cylindrical cams 22A and 22B is exemplified in the construction where cam groove 25 is formed as cam portion. However, it is also possible to form the cam portion with a cam ridge, such as a tapered rib, projecting in spiral fashion. Then, in this case, it is preferred that a contactor, such as cam follower, provided on the lower surface of the work table may grip the cam ridge from both sides. On the other hand, the guide members of the linear transporting paths 14A and 14B may also be guide ribs in place of the guide grooves 20 to slidably engage with the slider on the lower surface of the work table 17.

Figure 4:
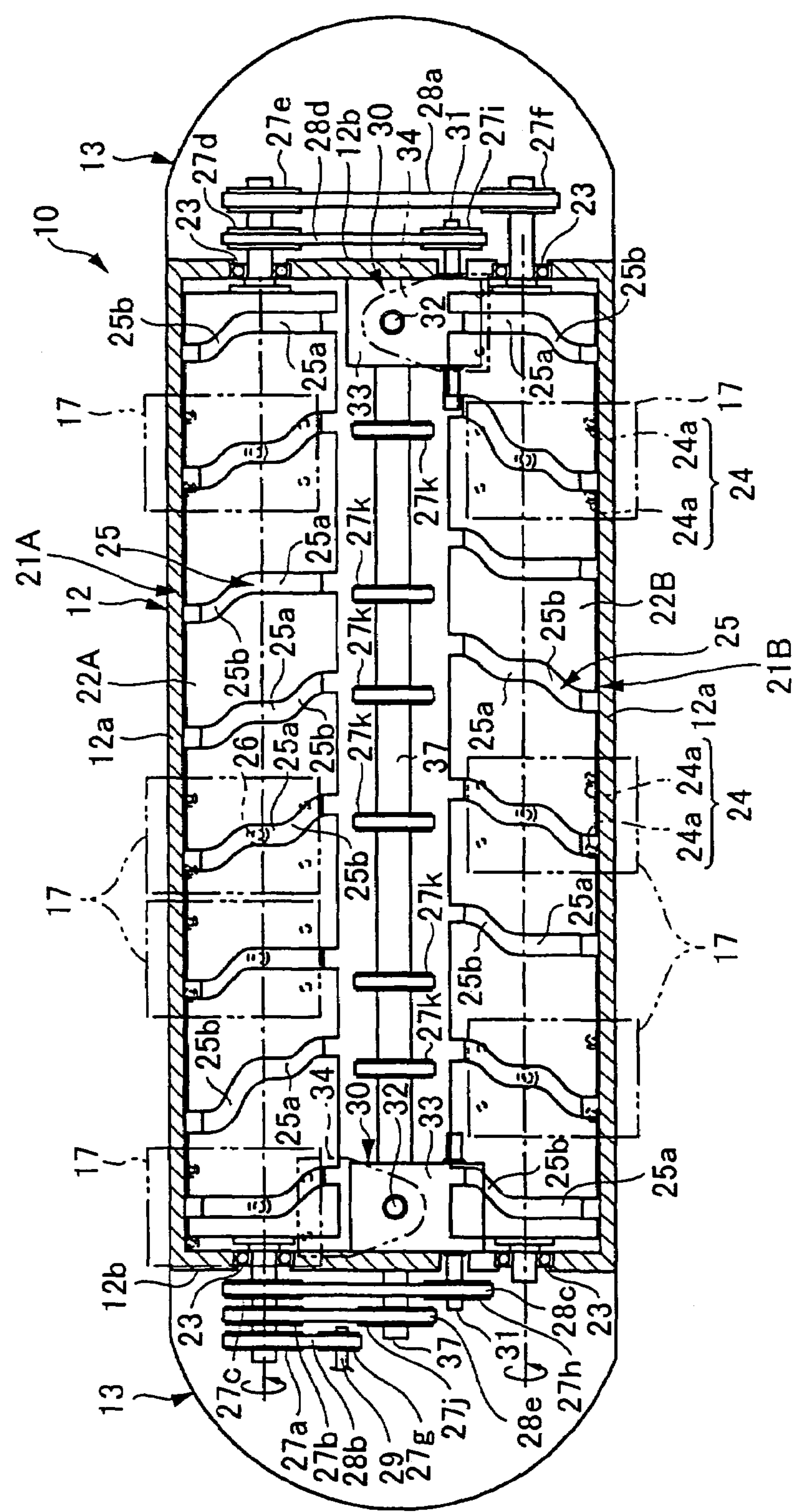
FIG. 4 is a sectional plan view showing a transporting mechanism portion within the transporting apparatus of FIG. 1.
Figure 5:
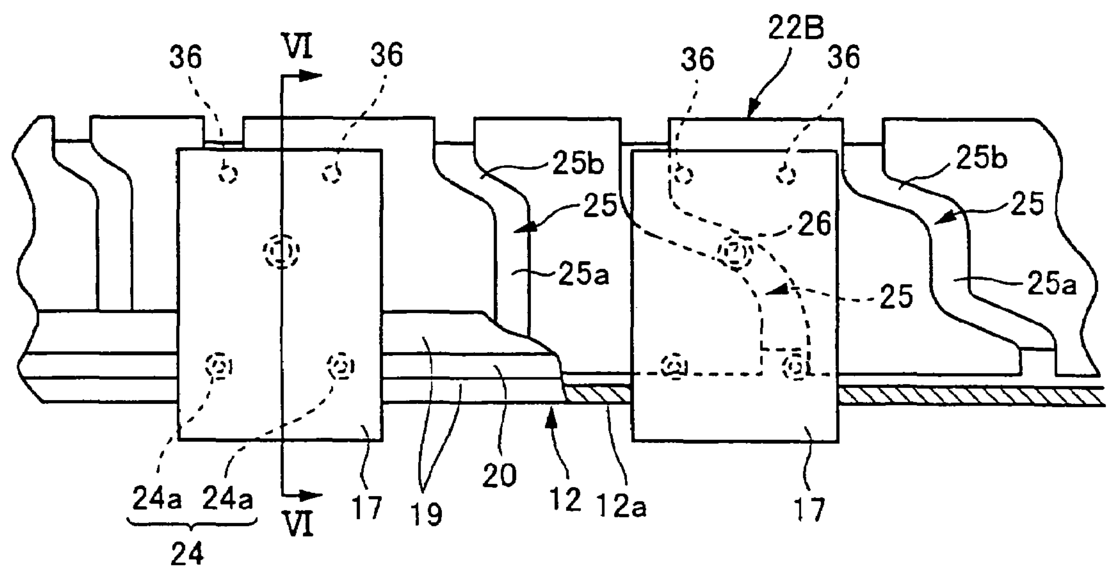
FIG. 5 is an enlarged plan view of the major part of the linear transporting mechanism portion shown in FIG. 4.
Figure 6:
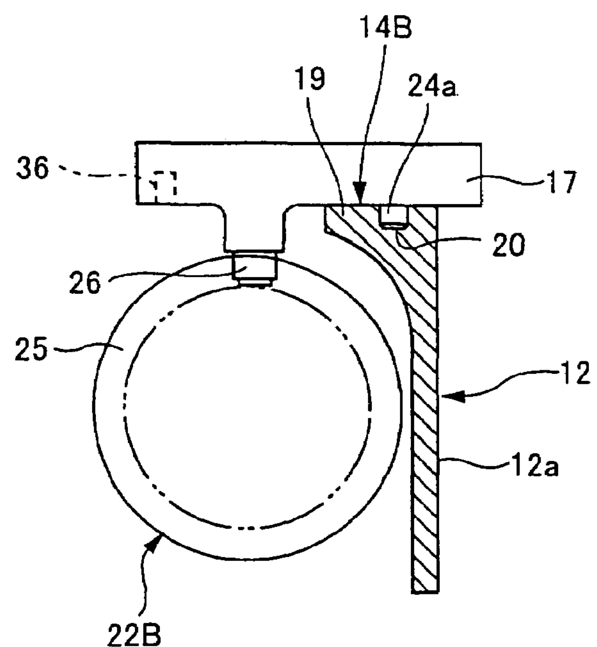
FIG. 6 is a section taken along line VI—VI of FIG. 5.

On the other hand, as shown in FIG. 4, both axial ends of the cylindrical cam 22A illustrated on upper side, is projected from outer side surfaces of the shorter wall portion 12*b* of the housing 13. On one of the axial end portion (left side in the shown case), three timing pulleys 27*a*, 27*b* and 27*c* are fixed. On the other hand, on the other axial end portion (right side in the shown case), two timing pulleys 27*d* and 27*e* are fixed. On a right side axial end of the cylindrical cam 22B illustrated on lower side, is provided from the shorter wall portion 12*b* of the housing. One timing pulley 27*f* is fixed on the extended portion of the cylindrical cam 22B.

The timing pulley 27*f* of the lower cylindrical cam 22B and the timing pulley 27*e* of the upper cylindrical cam 22A are linked by a timing belt 28*a*. On the other hand, the timing pulley 27*a* located at the left side end is linked with a rotary drive shaft 29 of the motor as driving source via a timing belt 28*b*. Thus, a rotary driving force of the driving source is transmitted to both cylindrical cams 22A and 22B for continuous synchronous rotation at equal speed, The spiral cam grooves respectively formed on two cylindrical cams 22A and 22B have mutually opposite spiral directions. Both cylindrical cams 22A and 22B are rotated in the same direction in a condition where respective cam grooves 25 are engaged with the work tables 17 for transporting the work tables 17 in opposite directions, i.e. left and right in the drawing. In the shown example, the work tables 17 are transported toward left in the upper linear transporting path 14A and the work tables 17 are transported toward right in the lower linear transporting path 14B. Namely, two linear transporting paths 14A and 14B are arranged with an angle of 180° in the transporting direction, and transportation terminating end of one linear transporting path and transportation starting end of the other linear transporting path are continuously adjacent in proximity with each other.

Figure 8:
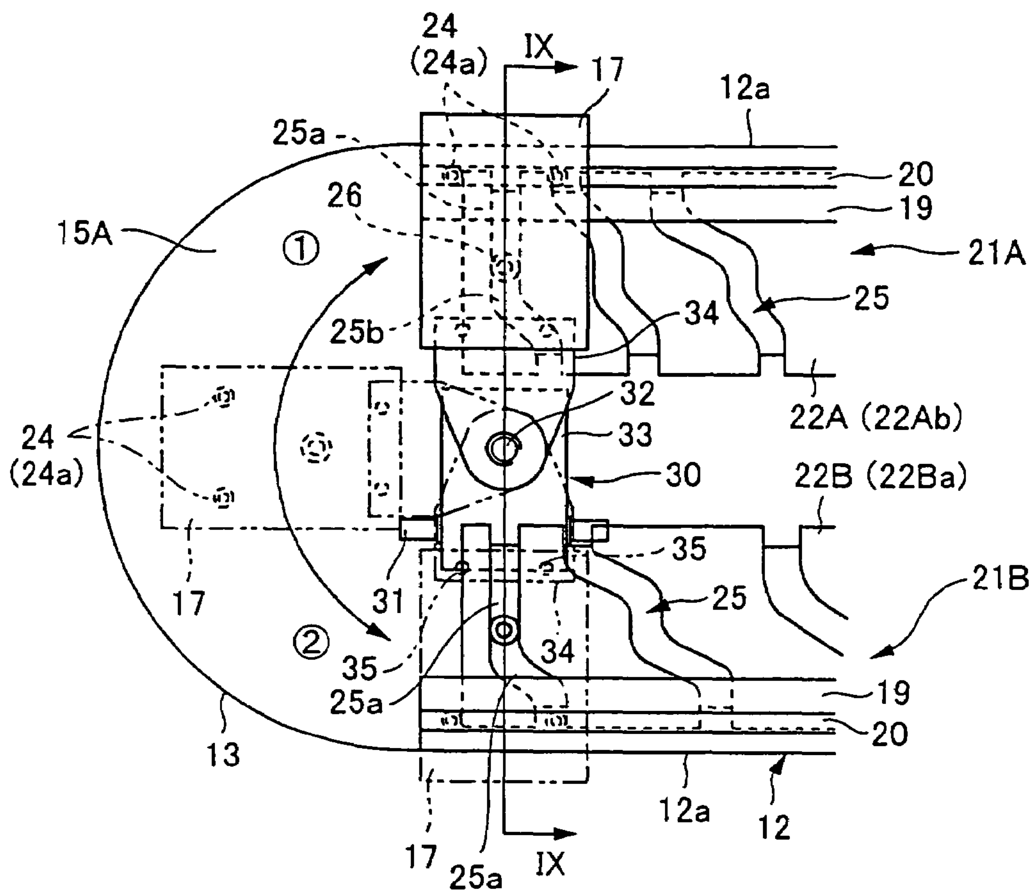
FIG. 8 is a plan view of pivotal transporting mechanism portion shown in FIG. 4.
Figure 9A:
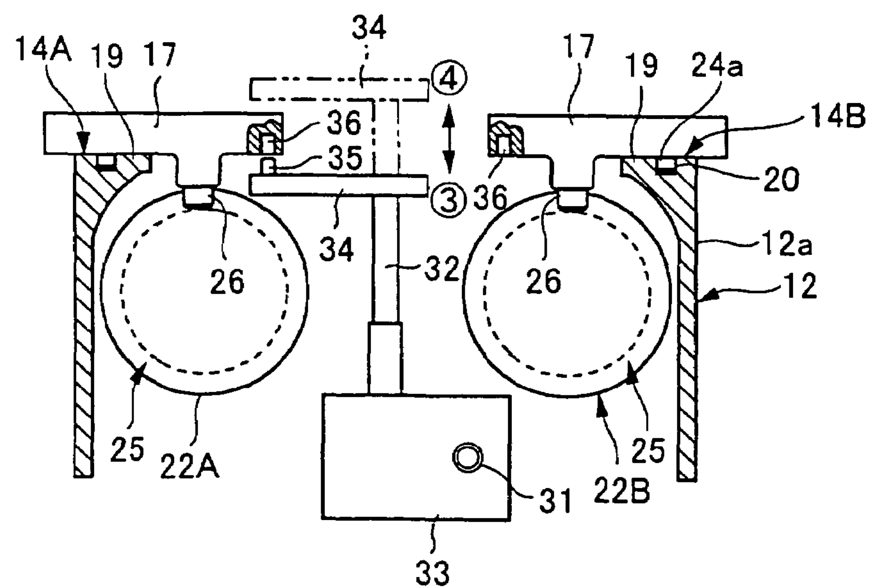
FIG. 9 is a section taken along line IX—IX of FIG. 8.
Figure 9B:
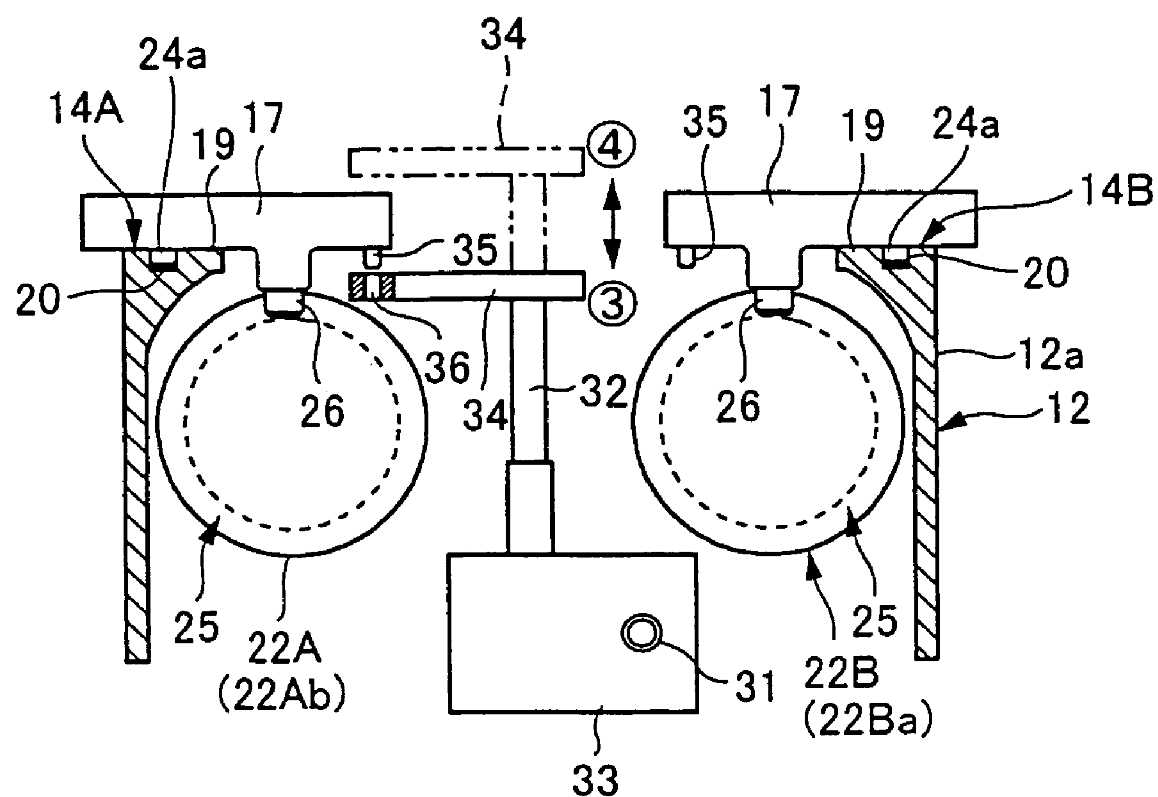

On both end portions in the longitudinal direction of the housing 12, pivotal transporting mechanisms 30 are provided respectively for connecting two linear transporting paths 14A and 14B and defining the curved transporting paths 15 (15A and 15B) for transferring the work table 17 reaching the transportation terminating end of one of the linear transporting path 14A or 14B to the transportation starting end of the other linear transporting path 14B or 14A. FIG. 8 shows the pivotal transporting mechanism 30 located on left side in FIG. 4. It should be noted that the pivotal transporting mechanism 30 located on right side in FIG. 4 has the identical construction. The pivotal transporting mechanism 30 is constructed by integrally mounting a plate form pivotal arm 34 extending in radial direction on an output shaft 32 of a cam arrangement 33 which transmits rotation of an input shaft 31 with conversion into a lifting motion in the axial direction and reciprocal rotating motion of the output shaft 32. The output shaft 32 is directed upwardly (namely, toward a direction in which the cam follower 26 and the slider 24 of the work table 17 are engageable to the counterpart cam groove 25 and guide groove 20). As shown in FIG. 9A, on an extended end of the pivotal arm 34, a pair of engaging pins 35 are provided extending upwardly. On the lower surface of the work table 17, a pair of engaging holes 36 are formed correspondingly to engage with the engaging pins 35. It should be noted that, as shown in FIG. 9B, as a modification, it is possible to project the engaging pins 35 from the lower surface of the work table 17 and to form a pair of engaging holes 36 engaging with the engaging pins 35 on the extended end of the pivotal arm 34.

Here, as the cam arrangement 33, while eliminated from illustration, any known construction may be employed. For instance, the cam arrangement 33 may constructed with a globoidal cam fixed on the input shaft 31, a turret having a cam follower on the outer periphery thereof for contacting and engaging with both side surfaces of a tapered rib of the globoidal cam for rocking motion about an axis perpendicularly intersecting with the input shaft depending upon displacement of the tapered rib, an output shaft engaged with the shaft of the turret in spline-engagement for sliding movement in axial direction, and a pivotal arm having a power point portion engaging with a grooved cam formed on an end face of the globoidal cam, a supporting point pivotably secured on a casing and an action point engaging with an axial end of the output shaft with permitting rotation of the output shaft, for transmitting continuous rotation of the input shaft 31 with separating into rocking rotation of the output shaft 32 and lifting motion in the axial direction.

Figure 10:
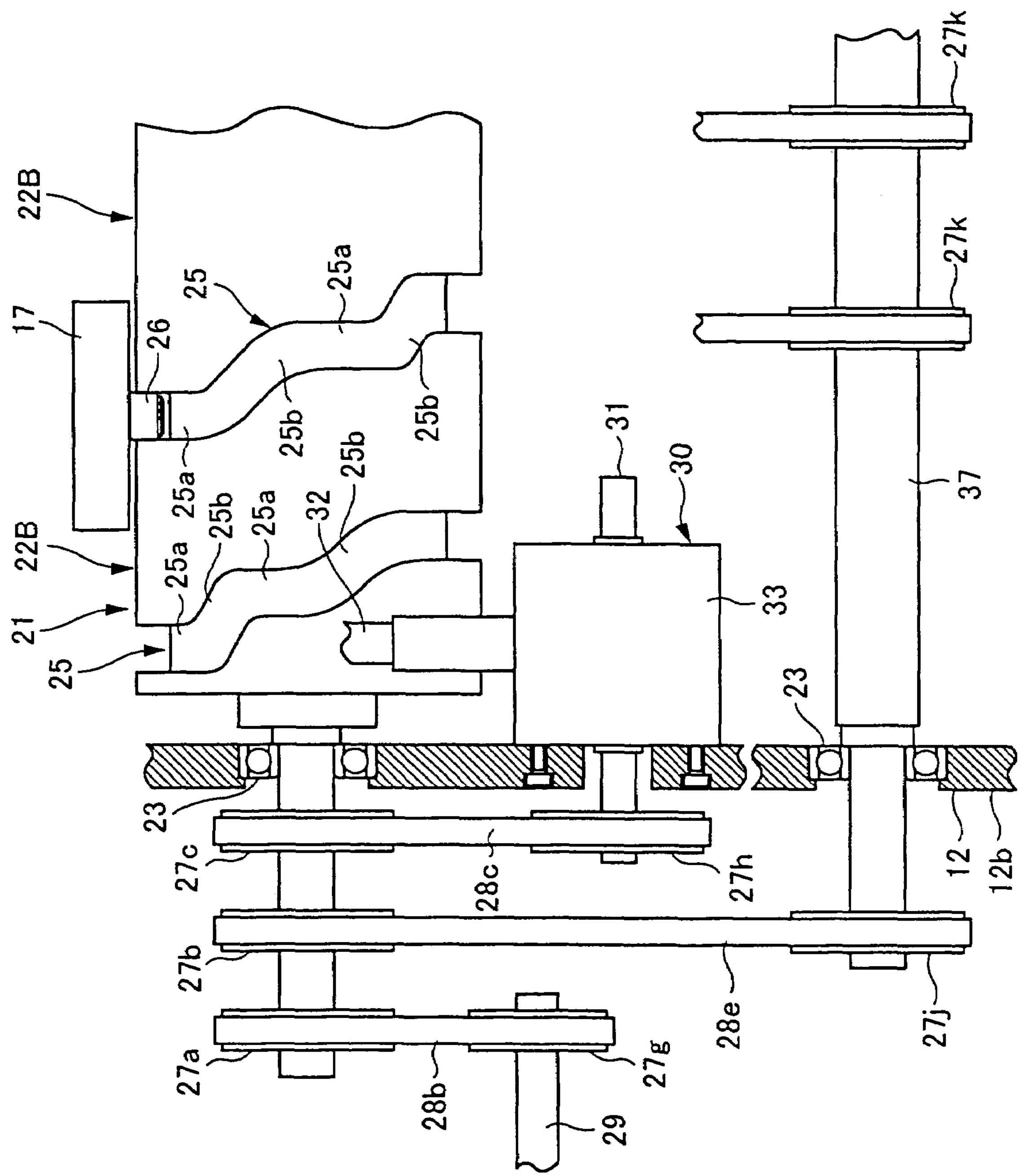
FIG. 10 is a front elevation of a synchronization mechanism portion for synchronizing the linear transporting mechanism portion and pivotal transporting mechanism in one embodiment.

FIG. 10 shows a synchronizing mechanism portion for synchronously driving the linear transporting mechanism portion and the pivotal transporting mechanism portion. As shown in FIGS. 10 and 4, two cam arrangements are respectively fixed on inside of shorter wall portions 12*b* opposing at both ends in longitudinal direction of the housing 12. Each input shaft 31 extends outwardly through the shorter wall portion 12*b*. On respective of extended ends 31*a*, timing pulleys 27*h* and 27*i* are provided. The timing pulleys 27*h* and 27*i* are drivingly linked with the timing pulleys 27*c* and 27*d* via timing belts 28*c* and 28*d* so that rotational torque of the cylindrical cam 22A is transmitted to both cam arrangement 33 in synchronism with each other.

On the other hand, the output shaft 32 is provided orienting upwardly. A position of axes of the output shafts 32 correspond to center between axes of two cylindrical cams 22A and 22B and match with positions where stopping zones 25*a* having no displacement in axial direction are set respectively as transportation terminating end and transportation starting end of the cylindrical cams 22A and 22B with respect to transporting direction of the cylindrical cams 22A and 22B. Namely, the transportation termination end position of one of the cylindrical cam 22 (22A or 22B), the transportation starting end of the other cylindrical cam 22 (22B or 22A) and the position of the output shaft 32 of the pivotal transporting mechanism are matched in the longitudinal direction of the housing 12. Namely, the output shafts 32 are located at a position equally distanced to adjacent transportation terminating end and the transportation starting end of the linear transporting paths 14A and 14B.

As shown in FIG. 9, in the condition where the output shafts 32 are lifted down at the lowermost position, the pivotal arms 34 mounted on the output shafts 35 may rotate without causing interference with the work tables 17 located to the transportation terminating end and the transportation starting end and the cylindrical cams 22 (22A and 22B). On the other hand, in the condition where the output shafts 35 are lifted up to the uppermost position, the work tables 17 are engaged with the pivotal arm 34 and the sliders 24 are completely released from the guide grooves to permit rotation without causing interference with the linear transporting paths 14 (14A and 14B).

In the lower portion at the center along the longitudinal direction of the housing, a driving force transmission shaft 37 for supplying rotational driving force to respective kinds of work implementing units, such as working robots or the like mounted on the mounting bases 18 which are supported rotatably on the shorter wall portions 12*b*. Rotational torque of the cylindrical cam 22A is transmitted to the driving force transmission shaft 37 in synchronism via the timing pulleys 27*b*, 27*j* and timing belt 28*e*. To each work implementing unit, a rotational torque is supplied from a power taking out timing pulley 27*k* provided at an appropriate position on the rotational driving force transmission shaft 37 in synchronism.

Figure 11:
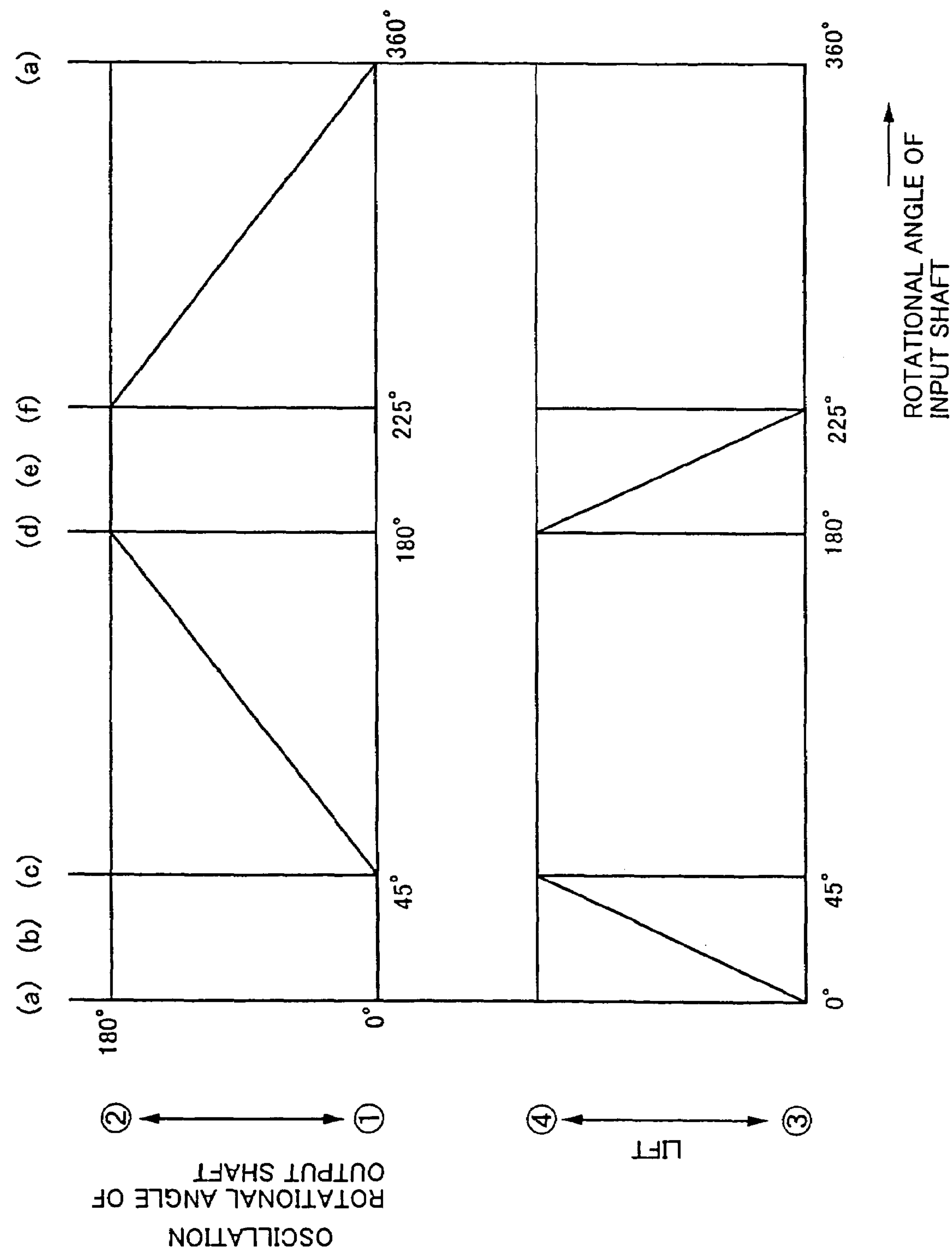
FIG. 11 is a timing chart showing an operation timing of the pivotal transporting mechanism portion.
Figure 12A:
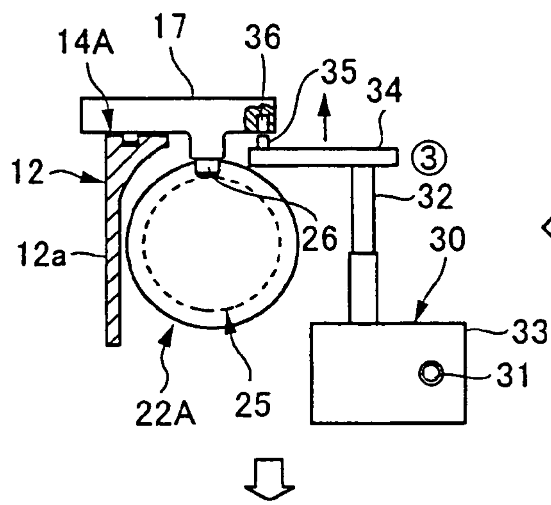
FIG. 12 is an illustration showing operational steps of the pivotal transporting mechanism in order.
Figure 12F:
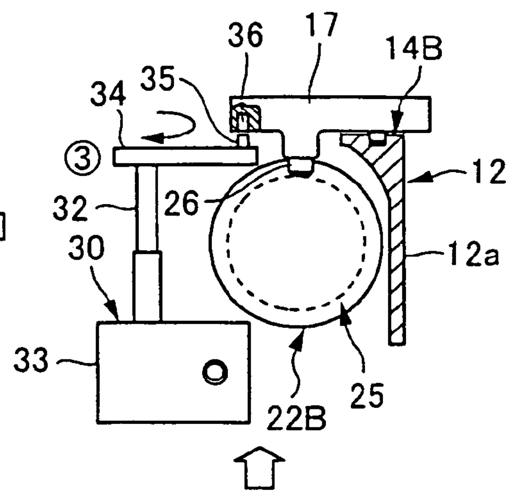
Figure 12B:
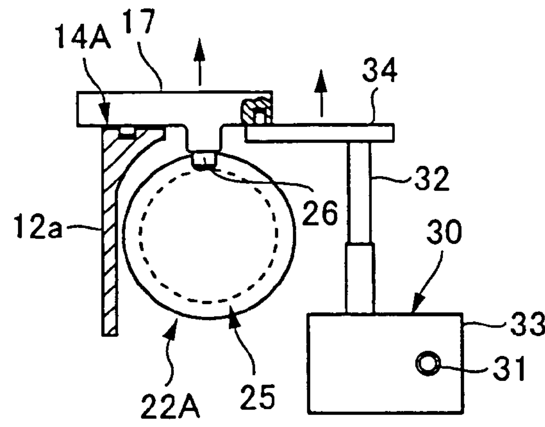
Figure 12E:
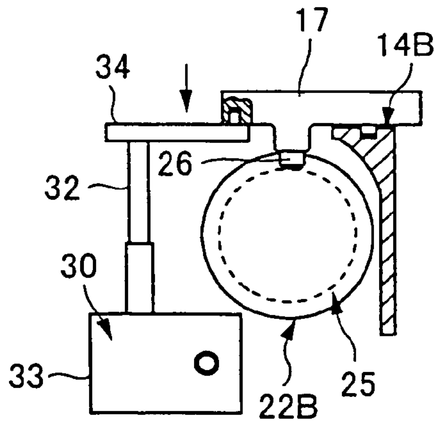
Figure 12C:
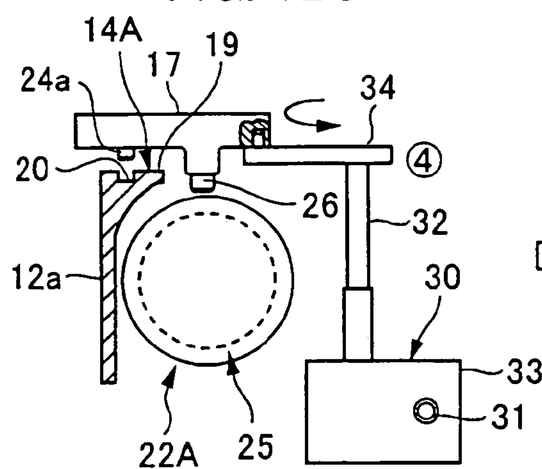
Figure 12D:
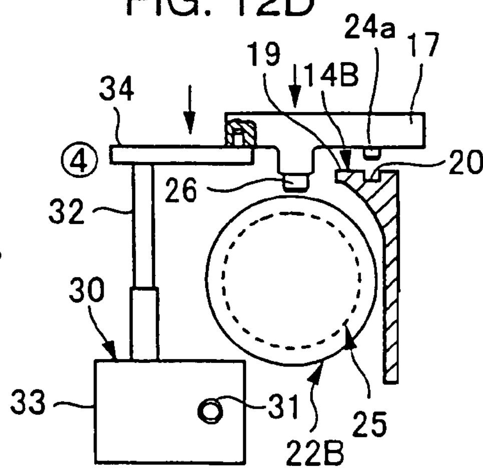

FIG. 11 is a timing chart of the cam arrangement 33 of the pivotal transporting mechanism 30. As shown, the cam arrangement 33 lifts the output shafts 32 up to the upper end within an angular range 0° to 45° ((a) to (c)) of the input shaft 31, is rotated over 180° in forward direction with maintaining the output shaft 32 in a condition lifted up to the upper end in the following angular range of 45° to 180° ((c) to (d)), is stopped rotation within the following angular range of 180° to 225° to lift down the output shaft 32 to the lower end position, and then is rotated in reverse direction with maintaining the output shaft 32 at the lower end position within the angular range of 225° to 360° ((f) to (a)). Subsequently, the foregoing actions are repeated.

Associating with operation of the cam arrangement 33 set forth above, as shown in FIG. 12, the pivotal transporting mechanism 30 transfers the work table 17 reaching to the transportation termination position of one of the linear transporting path 14A to the transportation starting position of the other linear transporting path 14B. Namely, FIGS. 12A to 12F show conditions at respective timings of (a) to (f) of FIG. 11. As shown, at first, in the condition shown in FIGS. 12A to 12C, associating with lifting the output shaft 32 upward, the engaging pins 35 of the pivotal arm 34 engage with engaging holes 36 on the lower surface of the work table 17 located at the transportation terminating end of one of the linear transporting path 14A to release engagement between the slider 24 and the guide groove 20 and engagement between the cam follower 26 and the cam groove 25. Next, in the condition shown in FIGS. 12C to 12D, associating with rotation of the output shaft 32 over 180°, the work table 17 is pivoted horizontally and transported to the position above the transportation starting end of the other linear transporting path 14B. In the subsequent condition shown in FIGS. 12D to 12F, the work table 17 is lowered associating with lifting down of the output shaft 32 to engage the slider 24 with the guide groove 20 of the linear transporting path 14B and to engage the cam follower 26 with the cam groove 25 to mount the worktable 17 on the support base 19. Thereafter, the pivot arm 34 is lowered to release the engaging pins 35 at tip end thereof from the engaging holes 36 on the lower surface of the work table 17. Then, in the condition shown in FIGS. 12F to 12A, the output shafts 32 are rotated in reverse direction to return to the initial condition.

Figure 7:
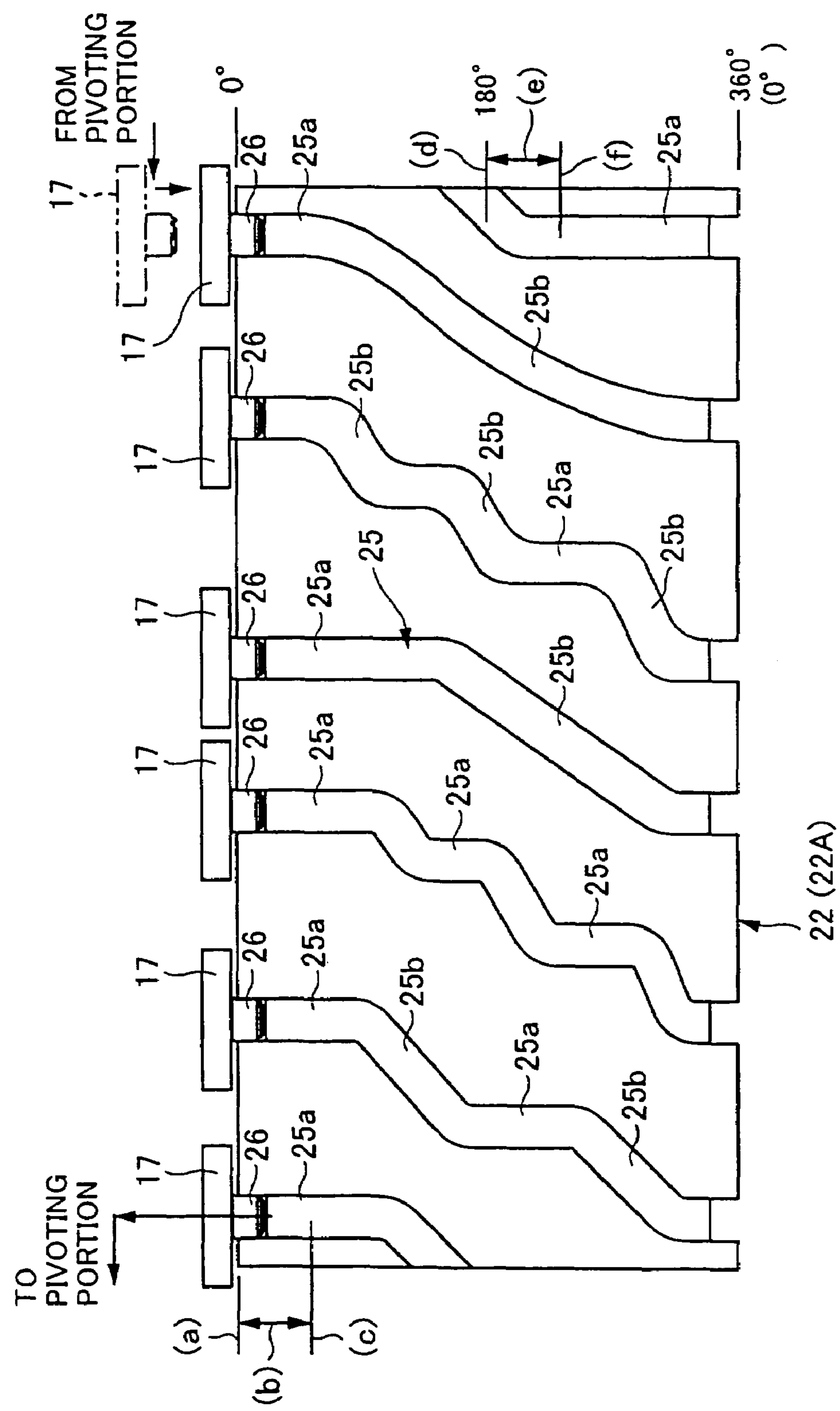
FIG. 7 is a development of cylindrical cams to be employed in the linear transporting mechanism.

Here, as shown in FIG. 7, within the range of (a) to (c) in the cam arrangement 33 of the pivotal transporting mechanism 30, in a relationship of the cylindrical cam 22A of the linear transporting mechanism 21 driving for synchronous rotation, the cam follower is placed within the stopping zone 25*a* of the cam groove 25 at the transportation terminating end. Within the range of (d) to (f), in relation to the cylindrical cam 22B, the cam follower is positioned within the stopping zone 25*a* at the transportation starting end to be actuated for synchronous rotation.

On the other hand, the cam follower 26 is engaged with the cam groove 25 of the cylindrical cam 22 (22A and 22B). Also, the work table 17 having the slider 24 engaging with the guide groove 20 of the support base 19 of the linear transporting path 14 (14A and 14B), is moved linearly on the linear transporting path 14 (14A and 14B) with temporary stop in the stopping zones 25*a* of the cam groove 25 associating with rotation of the cylindrical cam 22 (22A and 22B). On the upper surface of the main body 11, the work tables 17 are circulated in counterclockwise direction in FIG. 1 along oval track form transporting path 16 formed by the linear transporting paths 14 and the curved transporting paths 15. Then, in each work stations where the work tables are temporarily stopped, for the works held on the work tables 17, processing, assembling, inspection and other predetermined operation is performed by various work implementing unit.

In the discussion in connection with FIGS. 12A to 12F, engagement between the slider 24 and the guide groove 20 and engagement between the cam follower 26 and the cam groove 25 are released by lifting the work table 17 upward by the pivotal arm 34 according to expansion of the output shaft 32. It is also possible to pivotally transport the work table 17 without lifting up by extending the cam follower 26 and the cam groove 25 up to the end faces of the cylindrical cams 22 beyond both end portions of the transportation starting end and the transportation terminating end as shown in FIG. 7, opening both end of the guide groove 20 of the linear transporting path 14, forming the portion of the curved transporting path 15 located in the upper surface portion of the housing so as not to interfere with the slider 24 and the cam follower projecting from the lower surface of the work table 17 and designing so as to permit engagement between the slider 24 and the guide groove 20 and engagement between the cam follower 26 and the cam groove 25 by pivotal motion.

Accordingly, in the shown embodiment of the transporting apparatus 10 constructed as set forth above, operation timing in stopping and moving of the work tables 17 on the linear transportation path 14 (14A and 14B) depends on spiral shape (cam profile) of the cam groove 25 formed on the peripheral surface of the cylindrical cam 22 (22A and 22B). However, the spiral shape cam be easily designed by arbitrarily setting the position and length of the stopping zones 2*a* and gradient (magnitude of displacement in axial direction) in the transporting zone 25*b* adapting to requirement in operation. Thus, the position of the work station and stopping period can be appropriately set in each individual work station to provide large freedom.

Therefore, adapting to the work space required by respective kind of work implementing unit, such as robot or the like provided in each work station, interval between the work stations can be set appropriately to improve space efficiency. Also, adapting long and short of the operation period in each work station, the stopping period in each work station can be set easily to prevent wasteful waiting period in the work station where the operation can be completed in short period. Thus, the transporting apparatus 10 can be easily adapted for large number of kinds of works or products to improve general applicability and work efficiency.

On the other hand, by constructing the guide means for guiding the work table 17 for linear motion by the slider 24 engaging with the guide groove 20 of the linear transporting path 14, by mounting the cam follower on the lower surface of the work table 17 for releasably engaging with the cylindrical cam 22 driving the work table 17 to move linearly along the linear transporting path 14, by matching the engaging and releasing direction of the guide means for guiding linear motion of the work table 17 and the engaging and releasing direction of the cam follower 26 of the work table 17 and guide groove 25, the work table 17 can be easily engaged and released to and from the linear transporting mechanism 21 by vertically lifting the work table up and down in synchronism with the stopping zone of the cam groove 25 of the cylindrical cam 22 formed at the transportation terminating end and the transportation starting end of the linear transporting mechanism 21. Accordingly, it becomes possible to easily construct the pivotal transporting mechanism 30 compact in size, which can transfer the work table 17 from the transportation terminating end of one of the linear transporting mechanism 21A or 21B to the transportation starting end of the other linear transporting mechanism 21B or 21A by pivotal motion only by providing the output shafts 32 at a position equally distanced to the transportation termination end and the transportation starting end of two linear transporting mechanisms 21 (21A and 21B) arranged adjacent in proximity and mounting the pivotal arms 34 releasably engageable with work tables 17 on the output shaft 32.

On the other hand, since both of the linear transporting mechanisms 21 and the pivotal transporting mechanism 30 are constructed with cam mechanisms and not employ a chain to reduce lowering of dimensional accuracy due to accumulation of machining tolerance in comparison with conventional transporting apparatus employing the chain to improve motion accuracy and positioning accuracy of the work table 17. Furthermore, in comparison with the combination of chain and sprocket, wearing can be reduced to restrict increasing of error due to secular change resulting from wearing. Even in this point, degradation of motion accuracy and positioning accuracy can be suppressed.

Another embodiment of the transporting apparatus according to the present invention will be discussed with reference to FIGS. 13 to 16. It should be noted that, in the following description, like components to the former embodiment will be identified by like reference numerals and detailed description therefore will be eliminated in order to avoid redundant discussion and to keep the disclosure simple enough facilitate clear understanding of the present invention. With the shown embodiment, respective cylindrical cams 22A and 22B are divided into two fractions at the center in the longitudinal direction with maintaining rotary shaft portions at respective centers in common to separately form cylindrical cam fractions 22Aa and 22Ab located upstream side in the transporting direction and cylindrical cam fractions 22Ab and 22Bb located down stream sides in the transporting direction. The upstream side cylindrical cam fraction 22Aa and the downstream side cylindrical cam fraction 22Ab are placed in alignment in coaxial fashion. Similarly, the upstream side cylindrical cam fraction 22Ab and the downstream side cylindrical cam fraction 22Bb are placed in alignment in coaxial fashion. Between the upstream side cylindrical cam fraction 22Aa and the downstream side cylindrical cam fraction 22Ab and between the upstream side cylindrical cam fraction 22Ab and the downstream side cylindrical cam fraction 22Bb , a given length of clearances are defined. Within the clearance, sprockets 38 for transferring the work tables 17 reaching the transportation terminating ends of the upstream side cylindrical cam fractions 22Aa and 22Ab to the downstream side cylindrical cam fractions 22Ab and 22Bb with engaging a pair of engaging pins 35 provided in alignment in the transporting direction, and a synchronous actuation device 40 transmitting rotational torque to the sprocket and both cylindrical cams 22A (22Aa, 22Ab ) and 22B (22Ab, 22Bb) are provided. The engaging pins 35 are adapted to engage with the engaging holes 36 provided in the pivotal arms 34 for pivoting the work tables 17.

The synchronous actuation device 40 is constructed with an input shaft 42 vertically journaled on a casing 41 for rotation and projected upper and lower ends from the casing, globoidal cam 43 fixed to the center portion of the input shaft 42, two turrets 46A and 46B provided with a plurality of cam followers engaging with a taper rib 44 of the globoidal cam 43 and located at positions on both sides of the globoidal cam 43 with equal distance from the input shaft 42, and two output shafts 47A and 47B integrally provided with shaft portions of the turrets 46A and 46B and horizontally journalled on the casing 41. On the upper end portion of the input shaft 42, the sprocket 38 is rigidly secured. On the other hand, on the lower end portion of the input shaft 42, a reduction gear unit 49 is provided, which is, in turn, drivingly connected to a motor 51 provided on the bottom portion of the housing 12 via a timing belt 50 for inputting a rotary driving force. Two output shafts 47A and 47B are respectively projected from the casing 41 at both axial ends. On respective axial ends, the cylindrical cam fractions 22Aa, 22Ab, 22Ba and 22Bb are integrally secured. By this, synchronous rotational torque is transmitted to the sprocket 38 and respective cylindrical cam fractions 22Aa, 22Ab, 22Ba and 22Bb or driving to rotate both output shafts 47A, 47B and cylindrical cam fractions 22Aa, 22Ab and 22Ba, 22Bb in mutually opposite direction.

Figure 13:
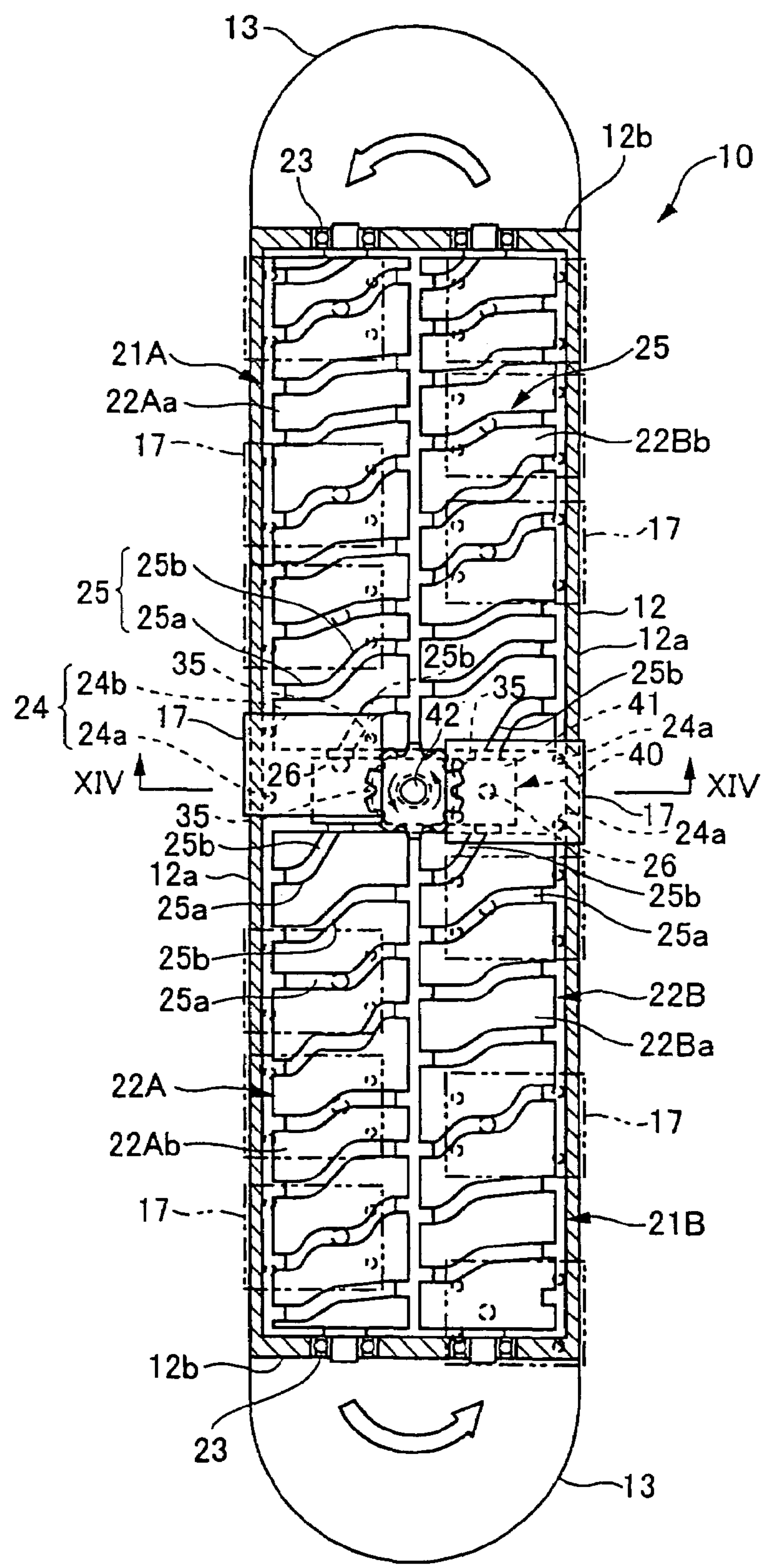
FIG. 13 is a plan view showing the linear transporting mechanism portion in another embodiment of the transporting apparatus according to the present invention.
Figure 14:
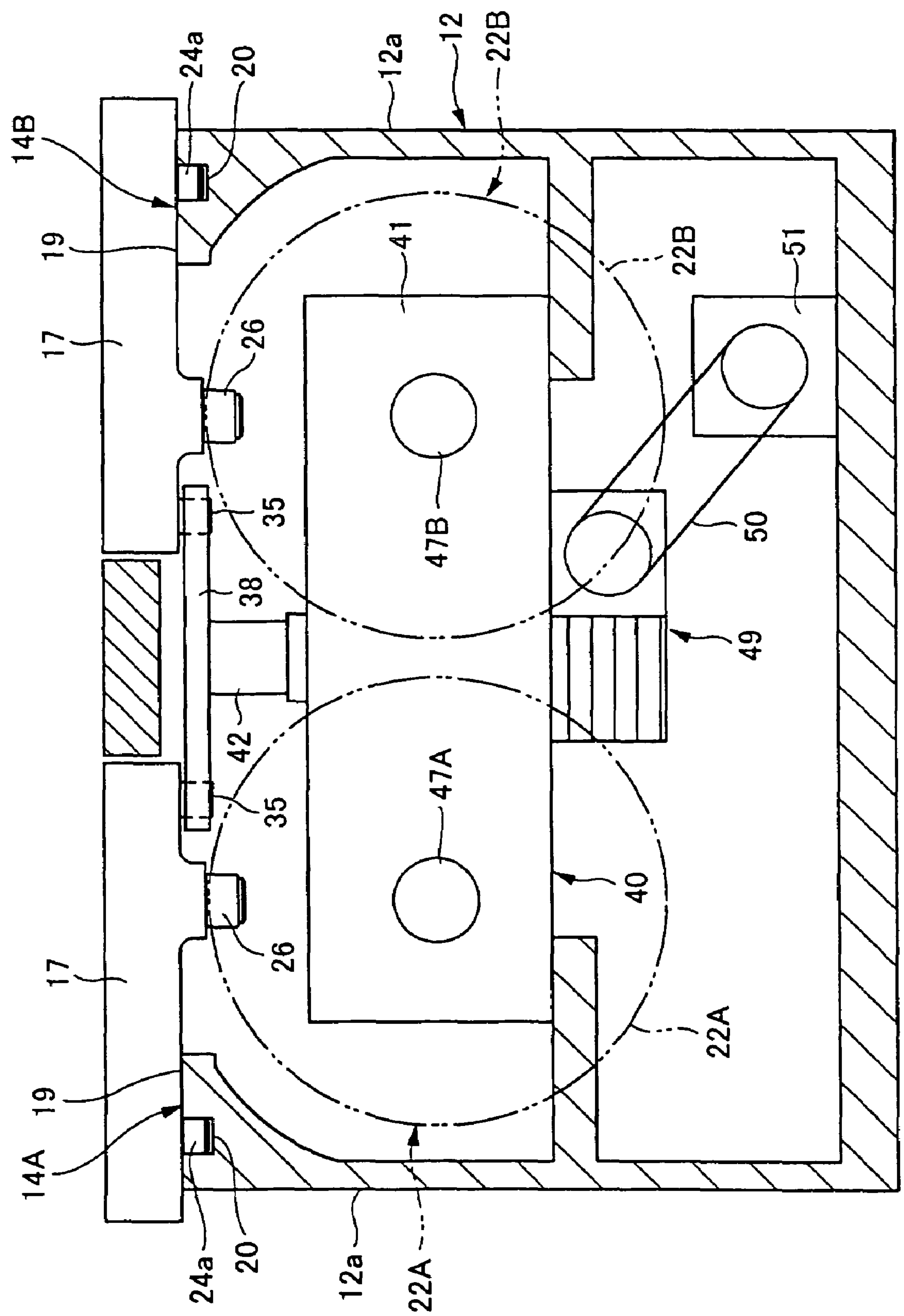
FIG. 14 is a section taken along line XIV—XIV in FIG. 13.
Figure 15:
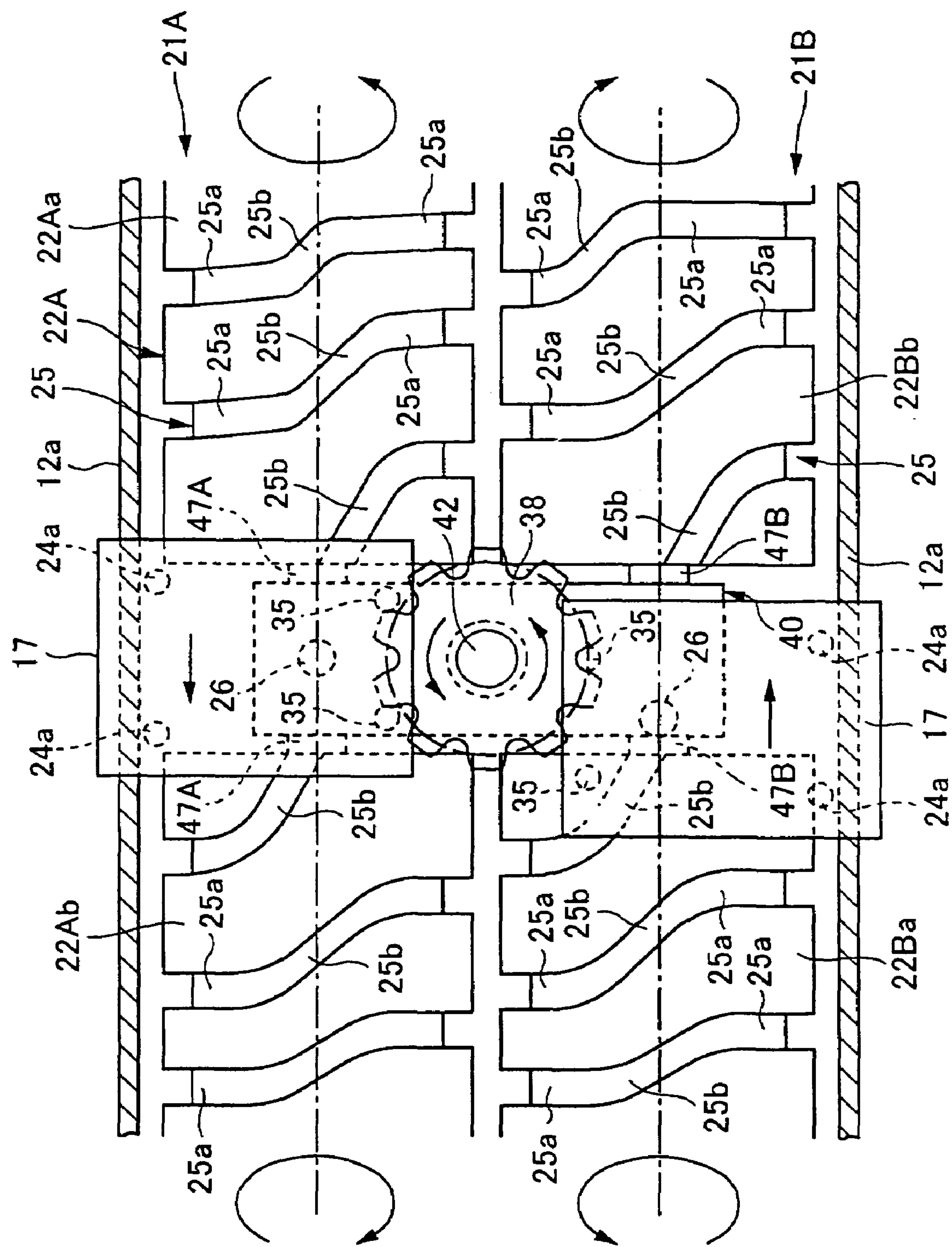
FIG. 15 is an enlarged plan view of a linear transporting mechanism portion of FIG. 13.
Figure 16:
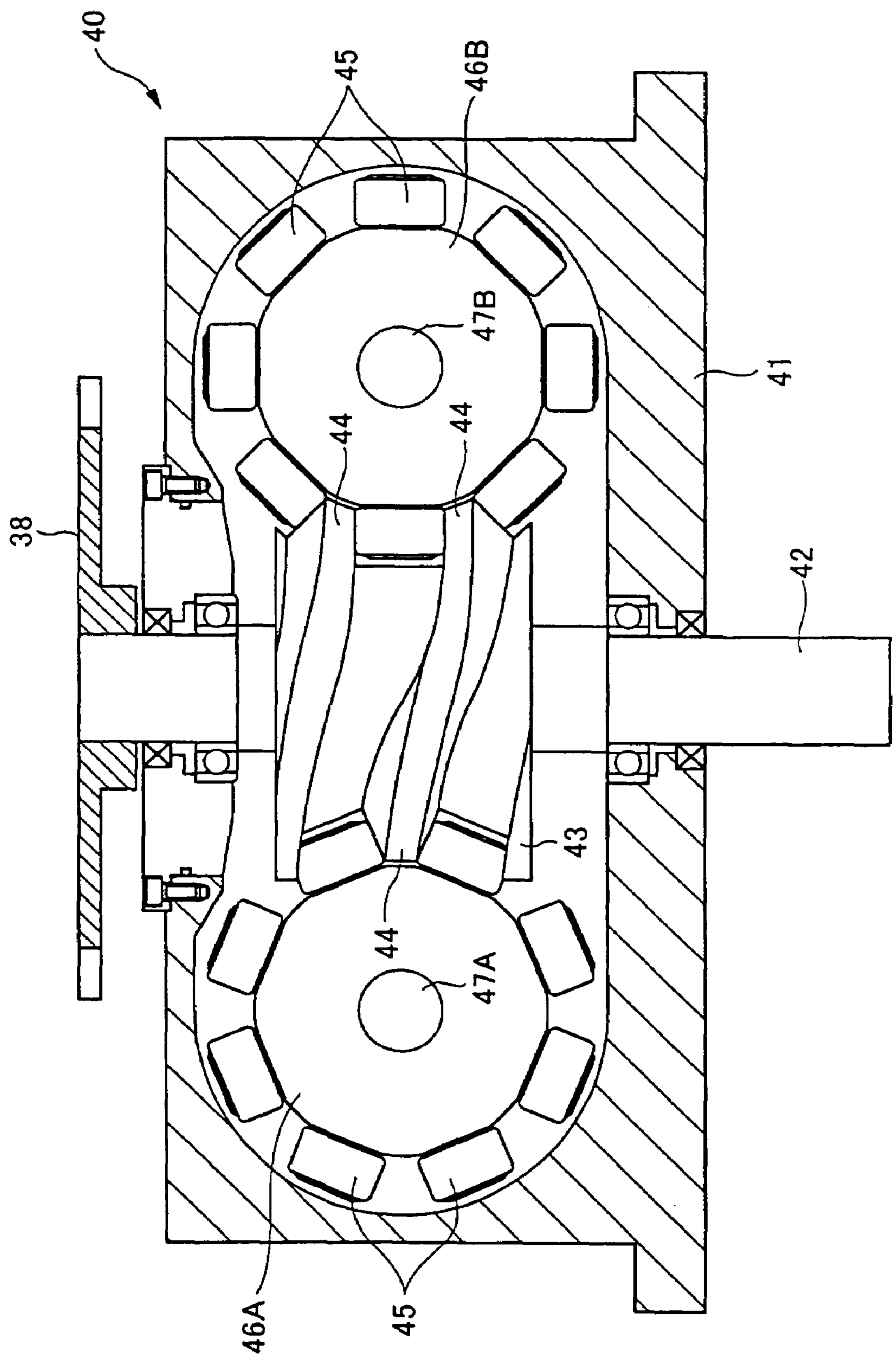
FIG. 16 is a longitudinal section of a synchronous actuation device.
Figure 17:
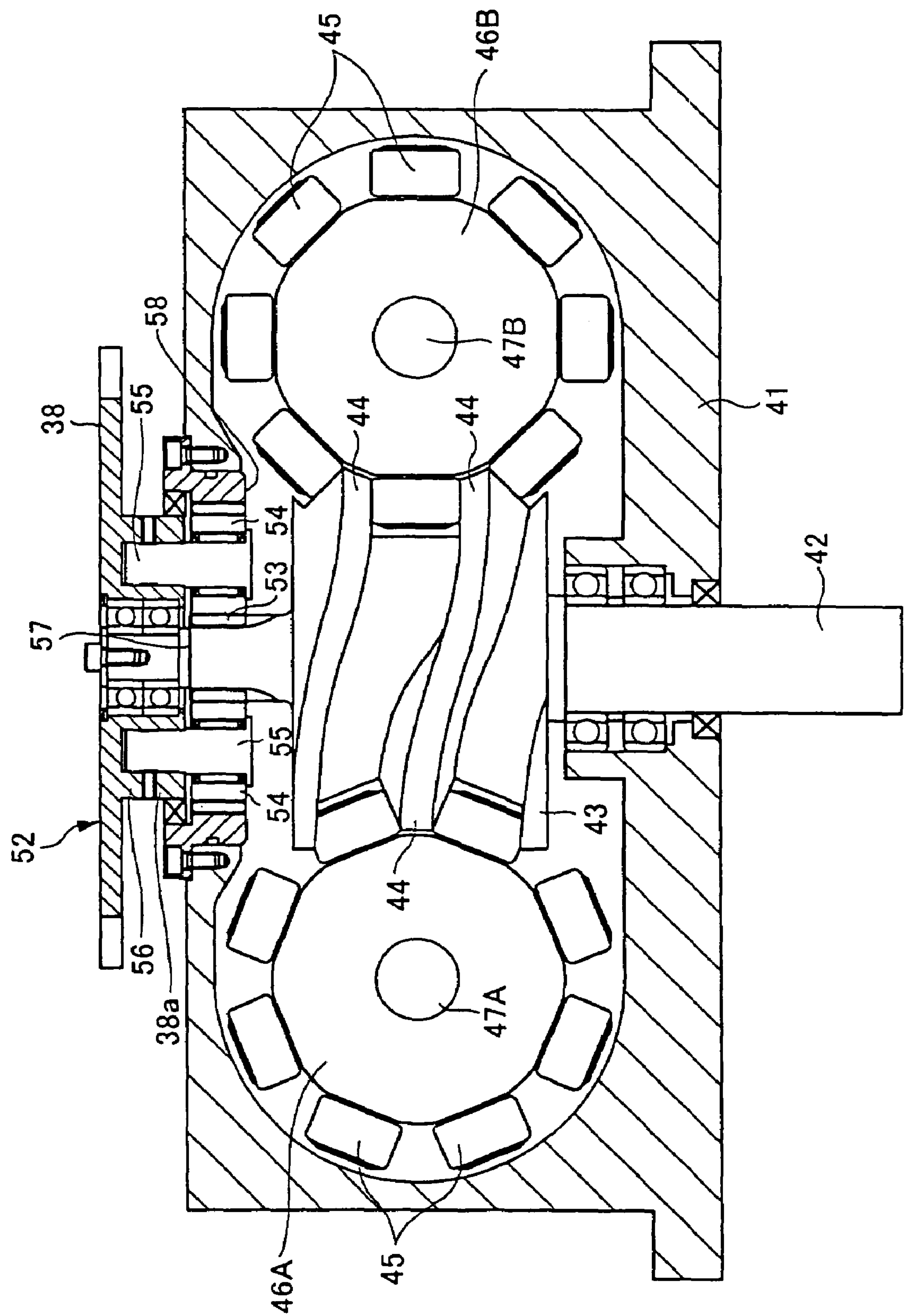
FIG. 17 is a longitudinal section of a modification incorporating a planetary gear mechanism in the synchronous actuation device.
Figure 18:
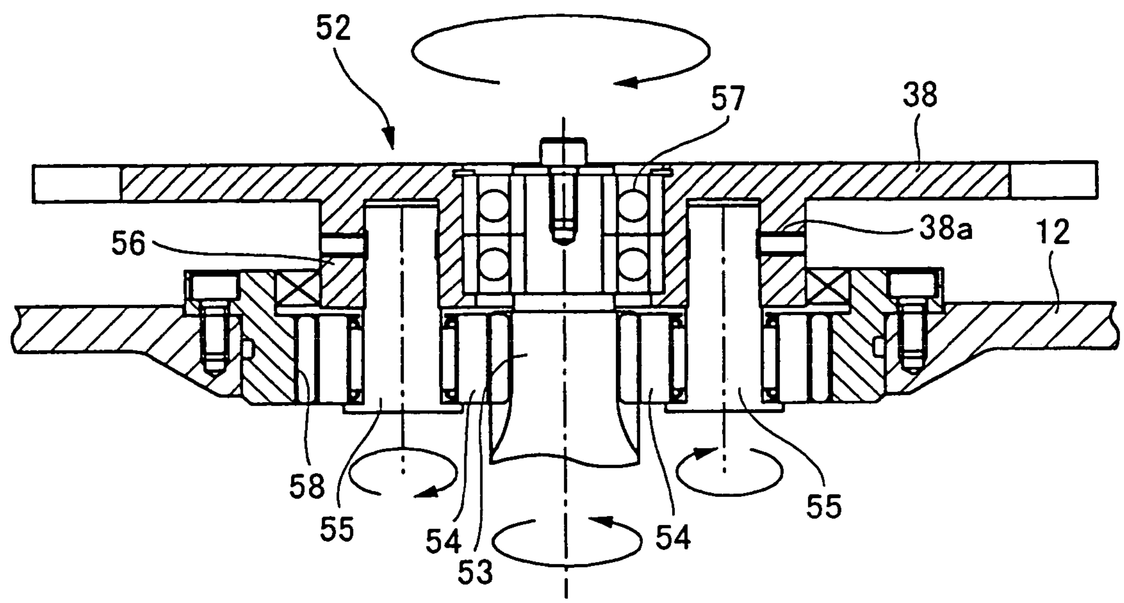
FIG. 18 is a longitudinal section of the planetary gear mechanism of FIG. 17.
Figure 19:
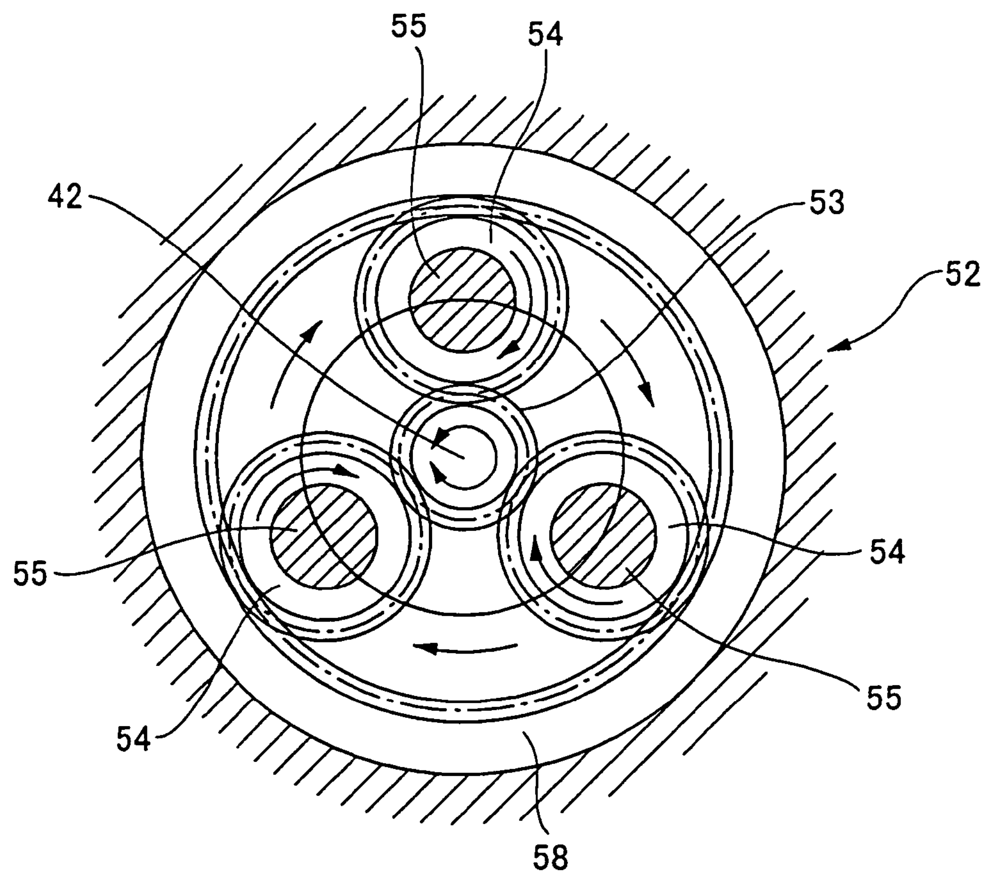
FIG. 19 is a sectional plan view of the planetary gear mechanism of FIG. 17.

Here, as shown in FIG. 13, upon transferring the work tables 17 from the upstream side cylindrical cam fractions 22Aa and 22Ba to the downstream side cylindrical cam fractions 22Ab and 22Bb of respective linear transporting mechanism 21A and 21B, in order to adapt to linear motion speed of the work tables 17 according to rotation of the sprocket 38, gradient of cam grooves formed in the transporting zones 25*b* of the transportation terminating ends of the cylindrical cam fractions 22Aa and 22Ba and the transportation starting ends of the cylindrical cam fractions 22Ab and 22Bb, are provided to be large for large axial displacement relative to angular displacement for increasing linear transporting speed. However, it is possible that the cam groove 25 satisfactorily adapting to high transporting speed by the sprocket 38 fixed to the input shaft 42. In such case, as a measure for this, it may be preferred to interpose a planetary gear mechanism 52 as a reduction gear unit between the input shaft 42 and the sprocket 38, as shown in FIGS. 17 to 19.

Namely, a sun gear 53 is formed in the upper portion of the input shaft 42. Then, a plurality of planet gears are provided meshing with the sun gear 53. A boss portion 38*a* of the sprocket 38 is formed with a planet frame 56 holding support shafts 55 of the planet gears. The sprocket 38 is rotatably supported on the upper end portion of the input shaft 42 via a bearing 57. Surrounding and meshing with the planet gears 54, an internal gear 58 is fixed on the housing 12. With such construction, the sprocket 38 is arranged coaxially with the input shaft 42 and a compact reduction gear mechanism can be interposed therebetween for reducing speed with synchronous rotation of the sprocket 38 to permit setting the transporting speed adapting to the transporting speed at the transportation terminating ends of the upstream side cylindrical cam fractions 22Aa and 22Ba and the transportation starting end of the downstream side cylindrical cam fractions 22Ab and 22Bb.

On the other hand, as shown in FIG. 13, the spiral cam grooves 25 respectively formed on the cylindrical cam 22A (22Aa, 22Ab) of one linear transporting mechanism 21A and the cylindrical cam 22B of the other linear transporting mechanism 21B have mutually same spiral direction. The cylindrical cam 22A (22Aa and 22Ab) and the cylindrical cam 22B (22Ba and 22Bb) are rotated in mutually opposite directions for transporting the work tables 17 engaging with respective cam grooves 25 in mutually opposite directions, i.e. left and right in the drawing. In the shown case, the work tables 17 on the linear transporting path 14A located left side in FIG. 13 is transported in downward direction and the work tables 17 on the linear transporting path 14B located right side in FIG. 13 is transported in upward direction. Namely, the two linear transporting mechanisms 14A and 14B arranged in parallel in the common housing 12 with differentiating transporting direction over 180°, and the transportation termination end and the transportation starting end are located adjacent with each other in proximity.

On both end portions in longitudinal direction of the housing 12, the pivotal transporting mechanisms 30 are provided respectively for connecting two linear transporting paths 14A and 14B and transferring the work table 17 reaching respective transportation terminating ends of the linear transporting paths 14A and 14B to the transportation starting ends of the other linear transporting paths 14B and 14A. Thus, by the pivotal transporting mechanisms 30, the curved transporting path 15 (15A and 15B) are defined. As the pivotal transporting mechanism 30, one discussed in connection with and illustrated in FIG. 9B may be employed.

Figure 20:
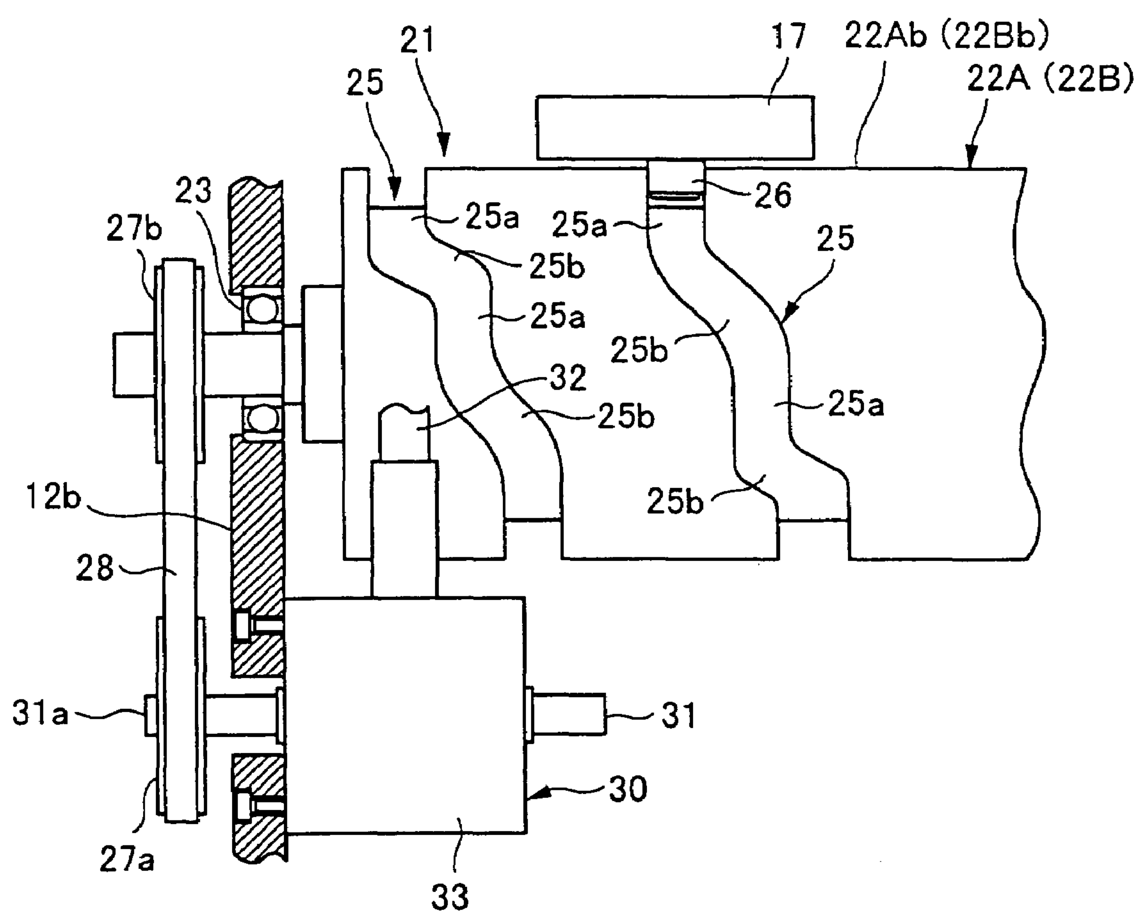
FIG. 20 is a front elevation of a synchronization mechanism portion corresponding to FIG. 10 in another embodiment of the transporting apparatus.

FIG. 20 shows a synchronizing mechanism portion for synchronously driving the linear transporting mechanism portion and the pivotal transporting mechanism portion in the present embodiment. As shown in FIG. 20, a cam arrangement 33 of the pivotal transporting mechanism 30 are respectively secured inside of the short wall portions 12*b* opposing at both longitudinal ends of the housing 12. The input shaft 31 is extended outwardly through the short wall portion 12*b*. On a projected end 31*a*, a timing pulley 27*a* is provided. The timing pulley 27*a* is linked to a timing pulley 27*b* respectively provided on axial ends of the terminating end side in the transporting direction (may also be starting end) of the cylindrical cam 22A (or 22B) of the linear transporting mechanism 21, by a timing belt 28 for synchronously transmitting rotational torque of the cylindrical cam 22A (or 22B) to two cam arrangements 33. On the other hand, as shown in FIG. 11, positions of the center axes of the output shafts 32 are located at the center between center axes of two cylindrical cams 22A (22Ab) and 22B (22Ba) in the linear transporting mechanisms 21 in plan view, and with respect to transporting direction of the cylindrical cams 22A (22Ab) and 22B (22Ba), are matched with position of stopping zone 25*a* where displacement in axial direction are respectively set as transportation terminating end and transportation starting end of the cylindrical cams 22A (22Ab) and 22B (22Ba).

With the shown embodiment set forth above, the cylindrical cams 22A and 22B of respective linear transporting mechanisms 21A and 21B are divided at the center in the longitudinal direction (axial direction) to separately form the upstream side cylindrical cam fractions 22Aa and 22Ba and the downstream side cylindrical cam fractions 22Ab and 22Bb arranged in alignment in coaxial relationship. Transfer of the work table 17 between a clearance between the upstream side cylindrical cam fractions 22Aa and 22Ba and the downstream side cylindrical cam fractions 22Ab and 22Bb, is performed by the sprocket. The sprocket 38 and upstream and downstream side cylindrical cam fractions 22Aa, 22Ab and 22Ba, 22Bb are driven for synchronous rotation by the synchronous actuation mechanism 40 at the center in the axial direction. Therefore, in comparison with the case where single cylindrical cam is provided over the entire lengths of the linear transporting paths 14A and 14B to rotatingly drive the same at the axial end, the lengths of respective of upstream and downstream side cylindrical cam fractions 22Aa, 22Ab, 22Ba and 22Bb become substantially half. Therefore, formation of the cylindrical cam fractions 22Aa, 22Ab, 22Ba and 22Bb can be facilitated. Furthermore, torsional deformation magnitude to be caused at the axial end associating with transmission of rotation driving torque becomes half to reduce possibility of occurrence of error resulting from deformation. In other words, it becomes possible the extend the length of the linear transporting paths 14*a* and 14*b* to be about double to permit arrangement of work stations with high space efficiency. In addition, since the work table 17 is linearly transferred on the linear transporting paths 14A and 14B by the sprocket 38 in discontinuous portion of the cylindrical cams 22A and 22B. Therefore, it becomes unnecessary to shift the timing (phase) between the upstream side cylindrical cam fractions 22Aa and 22Ba and the downstream side cylindrical cam fractions 22Ab and 22Bb. The globoidal cam type mechanism is employed in synchronous actuation mechanism 40 in the shown embodiment. However, the present invention should not be limited to the globoidal cam type mechanism but can be any mechanism which can transmit continuous rotation.

Figure 21:
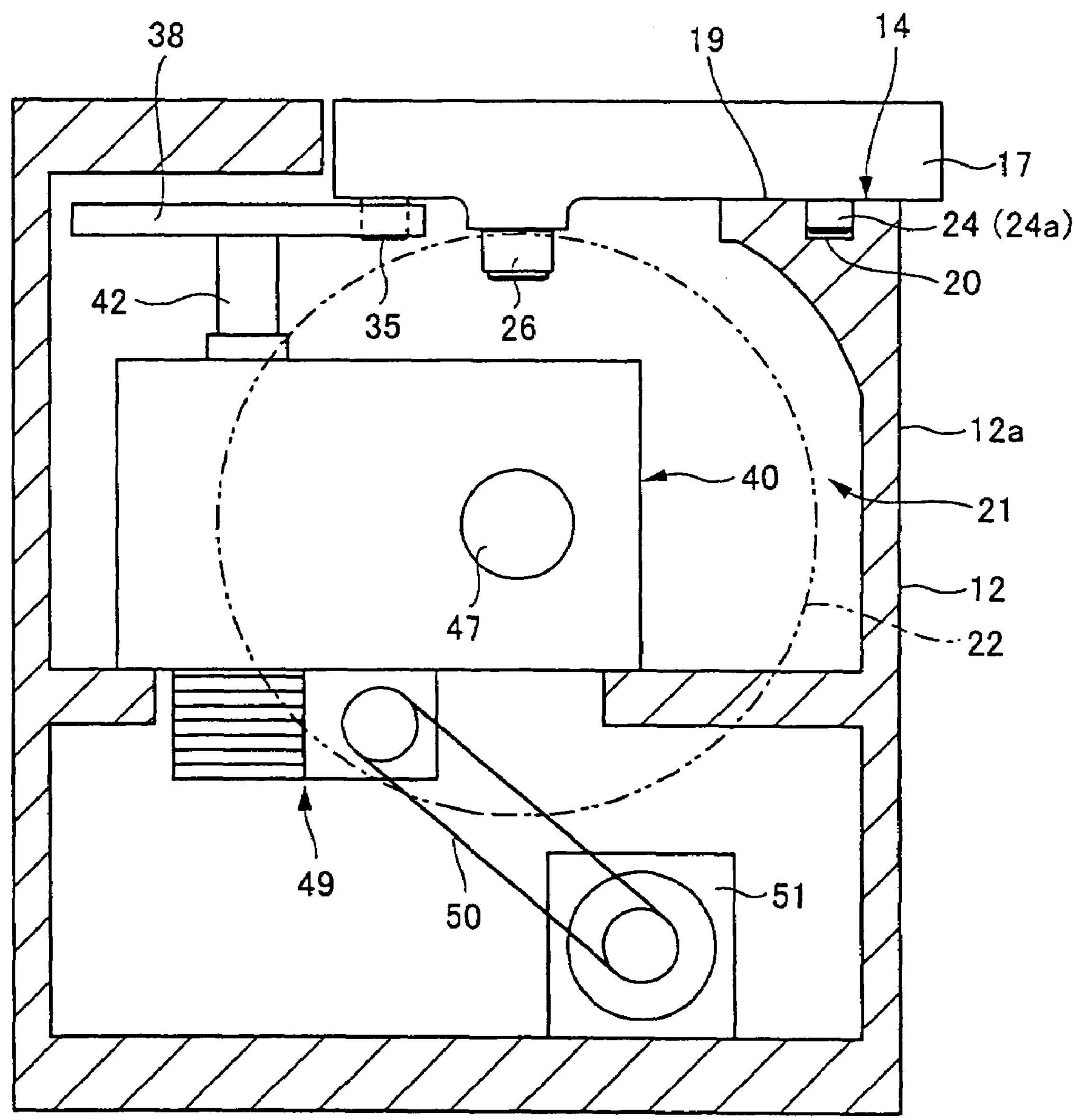
FIG. 21 is an illustration corresponding to FIG. 14 and showing one example of an embodiment of the transporting apparatus performing only linear transportation in one direction.
Figure 22:
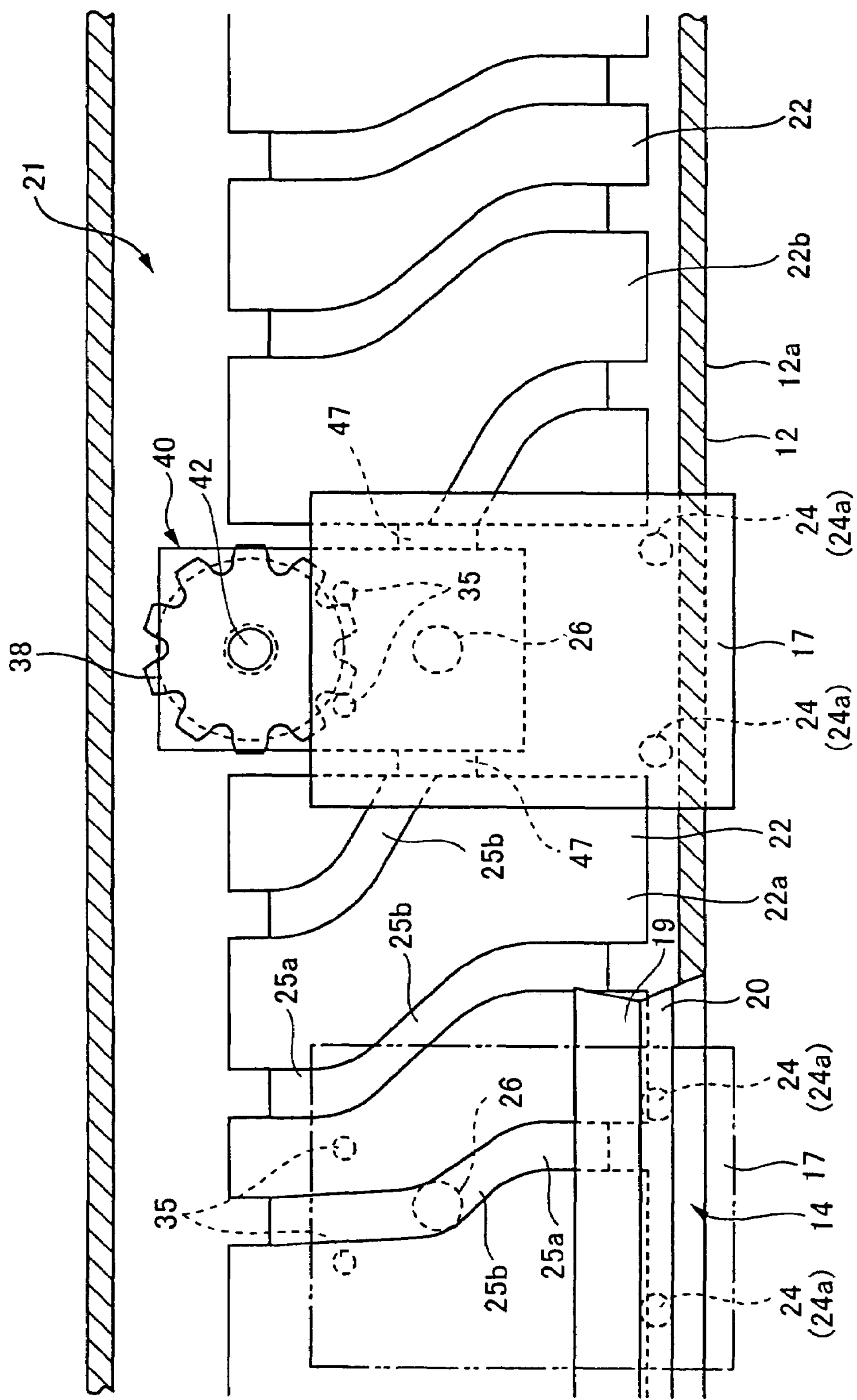
FIG. 22 is an illustration corresponding to FIG. 15 and showing one example of an embodiment of the transporting apparatus performing only linear transportation in one direction.

FIGS. 21 and 22 show an embodiment of a transporting apparatus which transports the work tables 17 linearly in one direction. FIG. 21 corresponds to FIG. 14 in the former embodiment and FIG. 22 corresponds to FIG. 15. As can be clear from comparison of FIGS. 14, 15 and FIGS. 21, 22, a difference therebetween is that while two cylindrical cam grooves 22A and 22B and the linear transporting paths 14A and 14B are transported in mutually opposite direction in the former embodiment, the shown embodiment is constructed with one cylindrical cam 22 consisted of the upstream side cylindrical cam 22*a* and the downstream side cylindrical cam 22*b* and one linear transporting path 14. It should be noted that, in the following description, like components to the former embodiment will be identified by like reference numerals and detailed description therefore will be eliminated in order to avoid redundant discussion and to keep the disclosure simple enough facilitate clear understanding of the present invention. Thus, by employing a plurality of transporting apparatus 10A dedicated for linear transportation in one direction, and combining these transporting apparatus 10A with the foregoing pivotal transporting mechanism 30, various form of transporting paths can be formed (see FIGS. 23A to 23D).

Figure 23A:
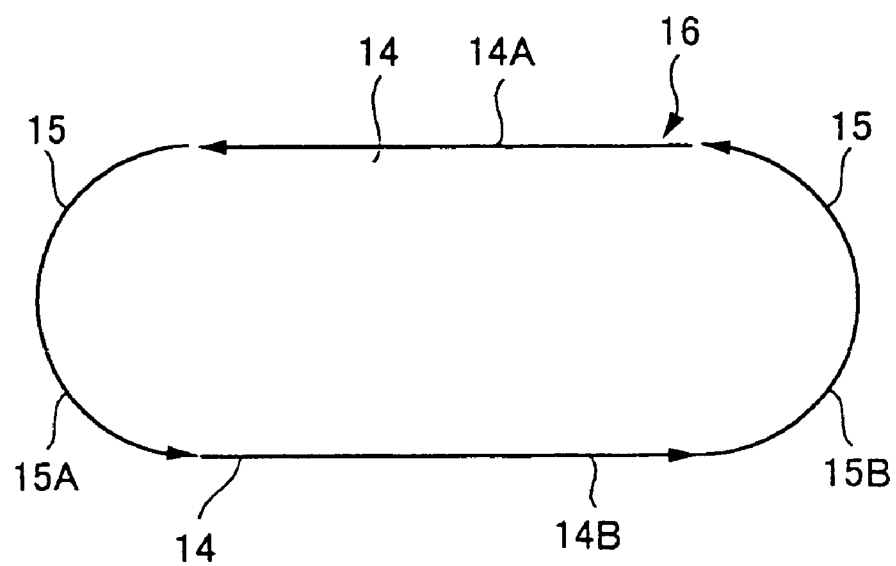
FIGS. 23A to 23D are general illustration showing an embodiment of a transporting path established by combination of a linear transporting mechanism and a pivotal transporting mechanism.
Figure 23B:
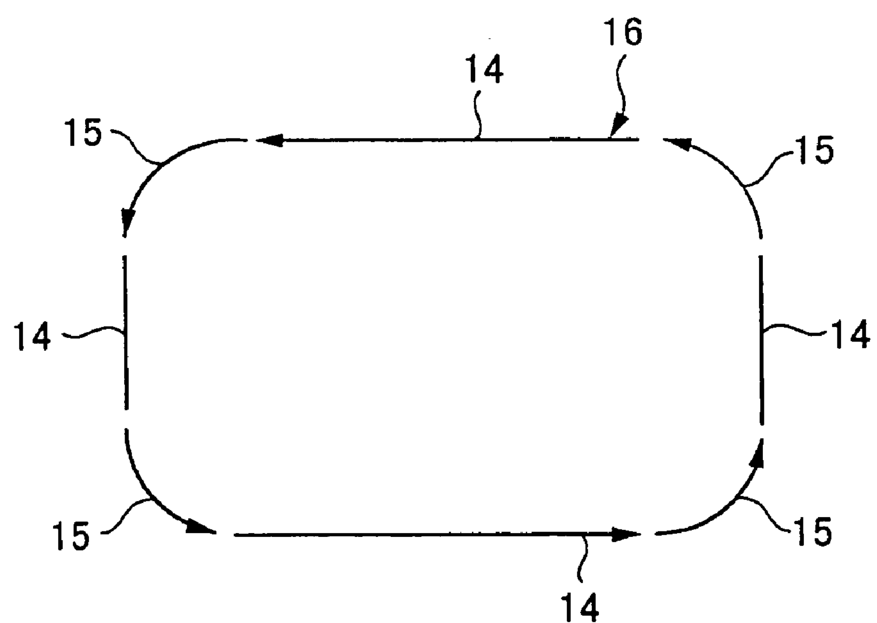
Figure 23C:
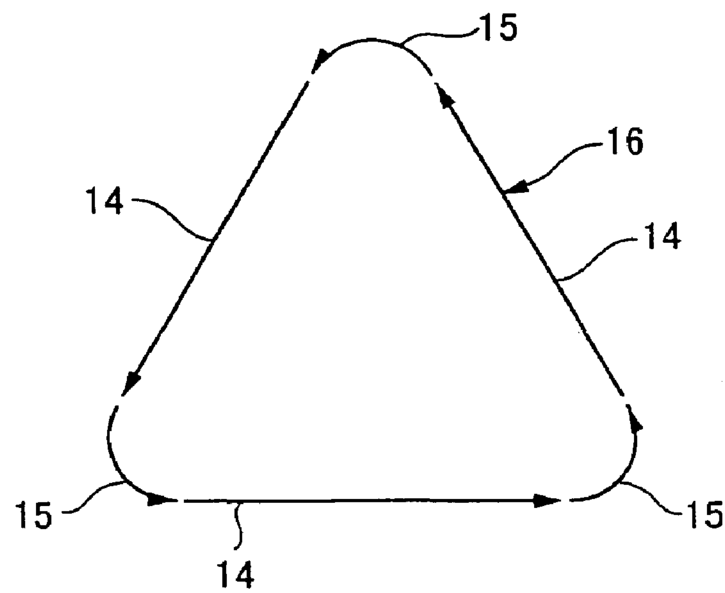

In the foregoing embodiment, as shown in FIG. 23A, the transporting path for transporting the work tables is consisted of two linear transporting paths 14 (14A, 14B) and two curved transporting paths 15 (15A, 15B) formed by two pivotal transporting mechanisms and connecting the transportation terminating ends and the transportation starting ends of the linear transporting paths and is formed into oval track shape. As shown in FIGS. 23B and 23C, transporting paths are formed by three or more linear transporting paths sequentially arranged with predetermined angles, and by connecting respective transportation terminating ends and transportation starting ends by corresponding number of curved transporting paths formed by pivotal transporting mechanisms performing pivotal transfer of the work table over corresponding angle. Thus, arbitrary polygonal circulating transporting path 16 can be formed easily. Namely, FIG. 23B shows an example of substantially rectangular circulating transporting path 16 by combination of respective two longer and shorter linear transporting paths and four curved transporting paths 15 respectively performing pivotal transfer over 90°. FIG. 23C shows an example of substantially regular triangular circulating transporting path 15 by connecting three linear transporting paths 14 by three curved transporting paths pivotably transporting over 120°.

Figure 23D:
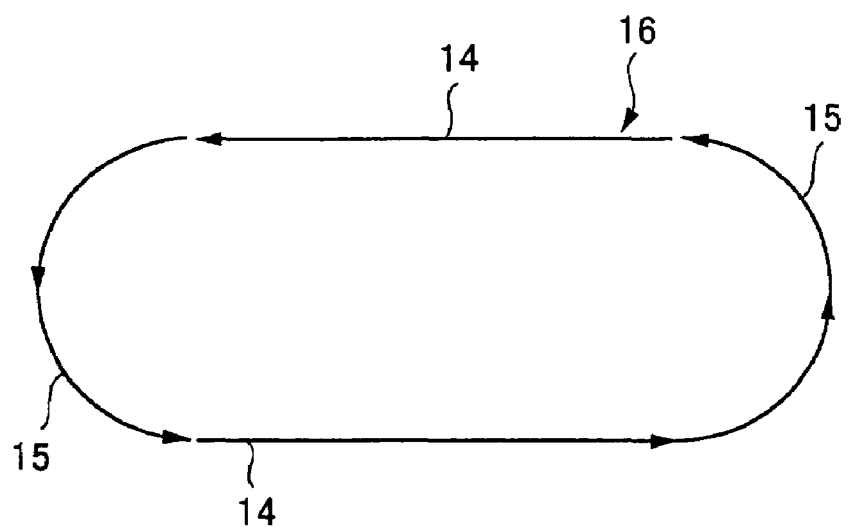
Figure 24A:
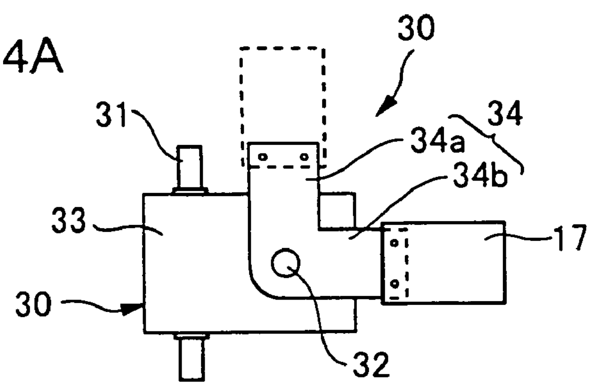
FIG. 24 is an explanatory illustration of the embodiment of the pivotal transporting mechanism to be used in the case where an intermediate stop point is provided in a curved transporting path as shown in FIG. 23D.
Figure 24B:
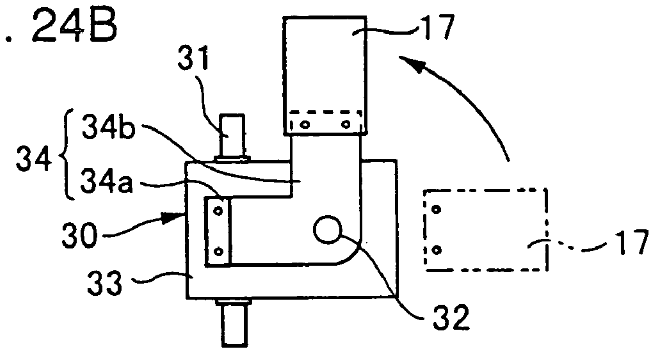
Figure 24C:
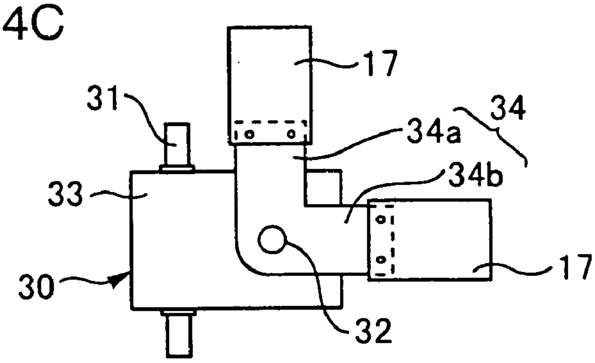
Figure 24D:
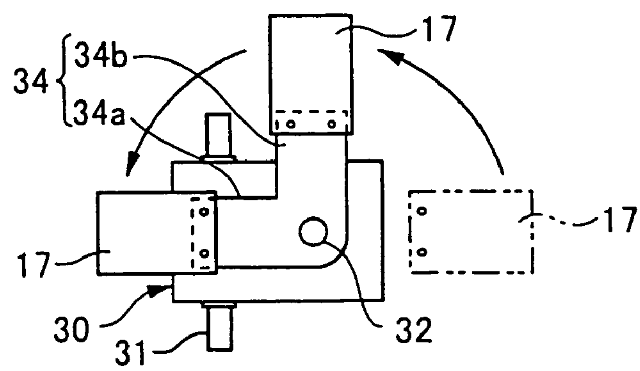
Figure 25:
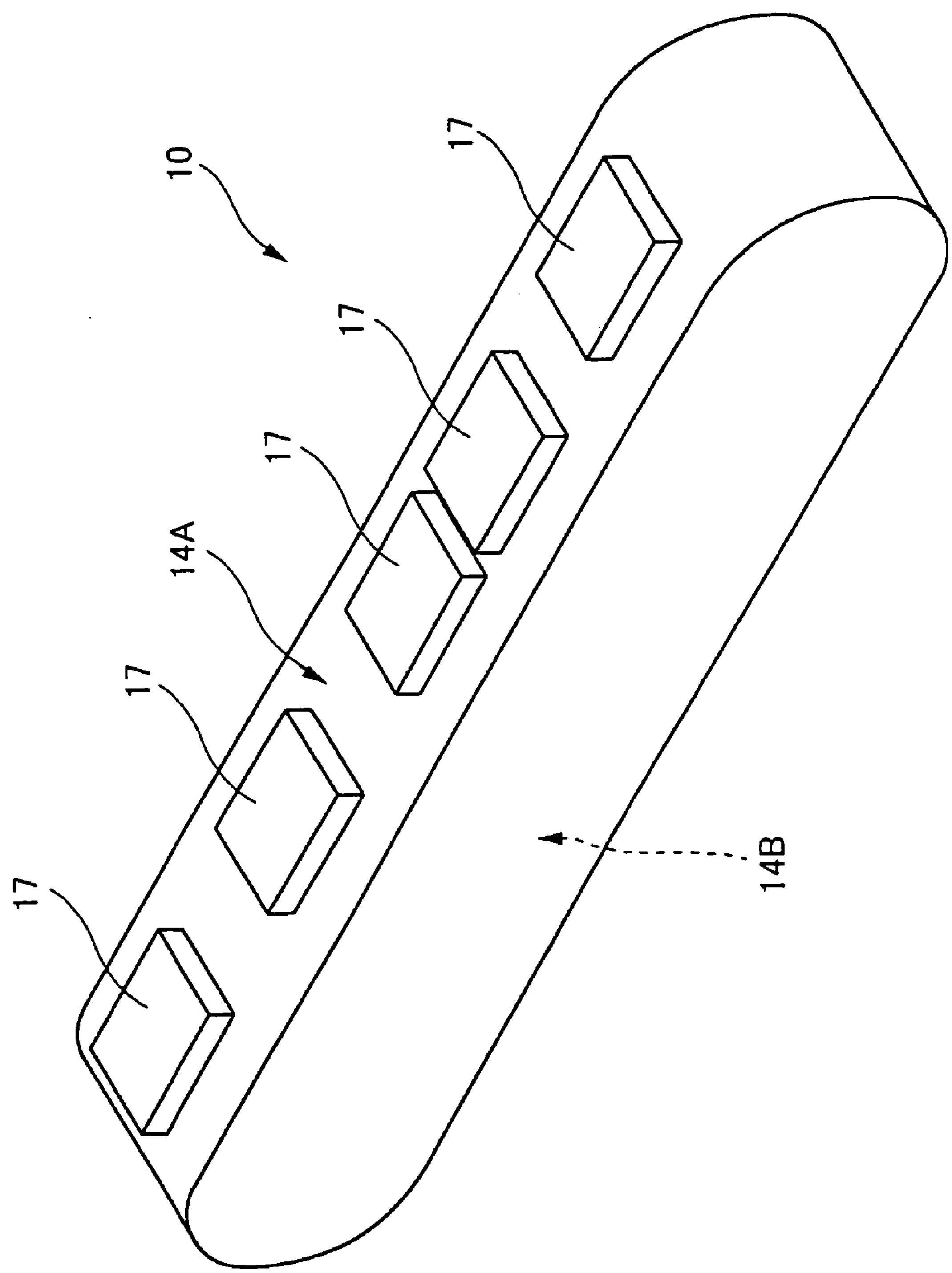
FIG. 25 is a general perspective view showing a further embodiment of the transporting apparatus according to the present invention.

On the other hand, as shown in FIGS. 24A to 24D, an L-shaped arm 34 having two arm portions 34*a* and 34*b* having equal length and orthogonally intersecting with each other is mounted on the output shaft 32 for pivotal motion over 90°. Thus, the work table 17 is pivotally transported over 180° by two actions of pivotal motion to provide an intermediate stop position in the mid portion of the curved transporting path 15 as shown in FIG. 23D. This point can be used as a work station.

It should be noted that the transporting path is not always required to be annular circulating path but can be any arbitrary forms. For instance, pivotal transporting mechanisms having opposite rotating directions may be provided to connect a plurality linear transporting mechanisms arranged in parallel relationship with each other, in meandering manner. Namely, by placing the transportation terminating ends and the transportation starting ends of the linear transporting paths of the linear transporting mechanisms are adjacent with each other in proximity with predetermined angle, and connecting adjacent the transportation terminating ends and the transportation starting ends of the linear transporting paths by the curved transporting paths of the pivotal transporting mechanism for pivotal transportation over the predetermined angle. In addition to meandering form, various configurations of transporting paths can be formed. Namely, with taking one linear transporting path of the linear transporting mechanism and one curved transporting path of the pivotal transporting mechanism, as minimum unit, and by combining one or more minimum units, various configurations of transporting paths can be formed.

On the other hand, in the foregoing embodiment, the transporting apparatus 10 is exemplarily illustrated and discussed by connecting two linear transporting paths 14A and 14B linearly transporting the work tables 17 in opposite direction and arranged in parallel in horizontal direction by two curved transporting paths 15A and 15B pivoting in horizontal direction. As shown in FIG. 25 and FIGS. 26A to 26F, two linear transporting paths 14A and 14B are arranged in vertically spaced parallel relationship, and the work tables 17 are reversed up-and-down in vertical direction to circulate in crawler form. It should be noted that, in FIGS. 26A to 26C, the upper side linear transporting path 14A and its linear transporting mechanism 21A are illustrated and lower side linear transporting path and the linear transporting mechanism are eliminated. On the other hand, in FIGS. 26D to 26F, the lower side linear transporting path 14B and its linear transporting mechanism 21B are illustrated and the upper side linear transporting path and the linear transporting mechanism are eliminated.

Namely, in this case, the quadrangular parallel piped housing 12 arranged laterally orienting the opening side for transporting the work tables 17 along respective upper surface and lower surface of longer wall portions 12*a* located in vertical opposition with each other. On the opening end edge of the housing, flat supporting piece 19*a* having outer surface projecting inwardly is formed integrally. In the supporting piece 19*a*, guide groove 20 for the work table 17 is formed.

The work table 17 is formed into L-shaped configuration consisted of a horizontal strip portion 17*a* and a vertical strip portion 17*b*. On the back surface of the vertical strip portion 17*b*, a slider 24 (a pair of engaging pins 24*a*) engaging with the guide groove 20 and a cam follower 26 engaging with the cam groove 25 of the cylindrical cam 22 (22A, 22B) of the linear transporting mechanism 21 (21A, 21B) are projected.

On the other hand, the can arrangement 33 of the pivotal transporting mechanism 30 are arranged with orienting the output shaft 32 in horizontal direction so that a pivotal arm 34 is pivoted on a vertical plane. Engaging holes 36 engaging with a pair of engaging pins 35 provided on an extended end of the pivotal arm 34 are formed on the back surface of the vertical strip portion 17*b* of the work table 17.

Figure 26A:
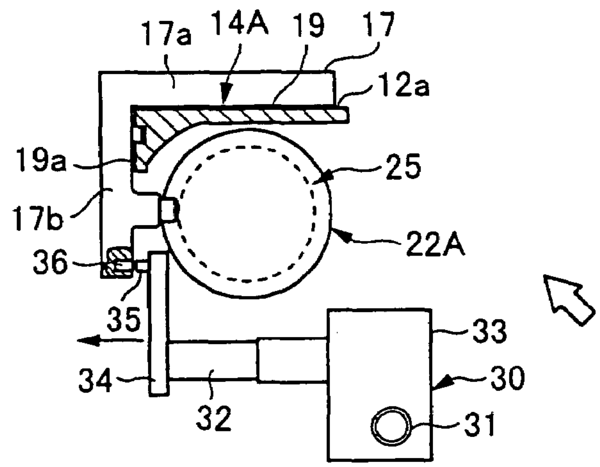
FIG. 26 is an illustration showing operation steps of pivotal transporting mechanism of the transporting apparatus shown in FIG. 26.
Figure 26B:
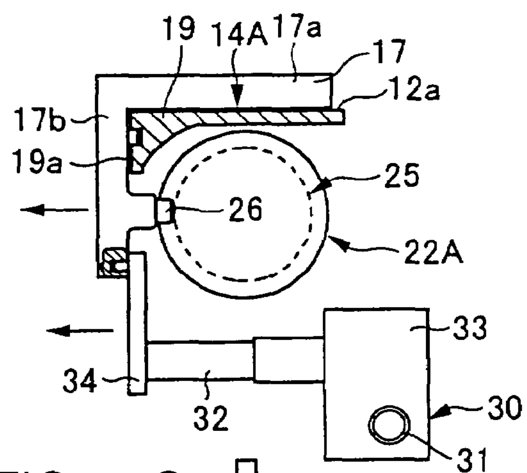
Figure 26C:
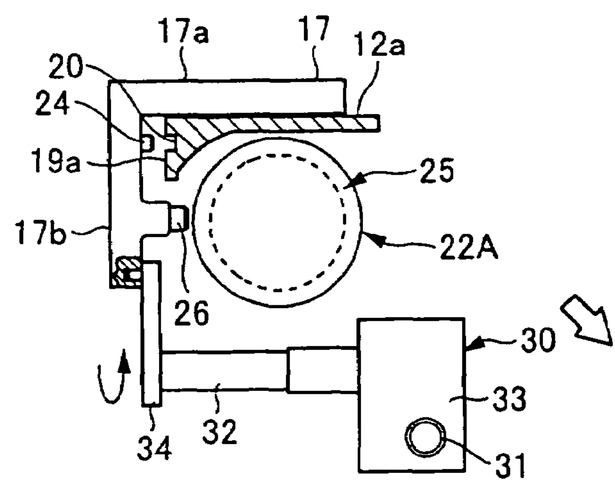
Figure 26F:
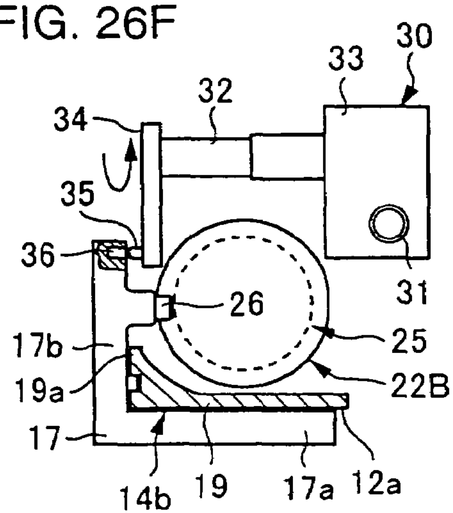
Figure 26E:
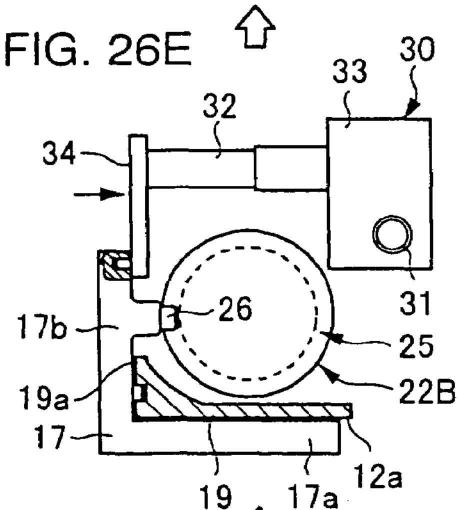
Figure 26D:
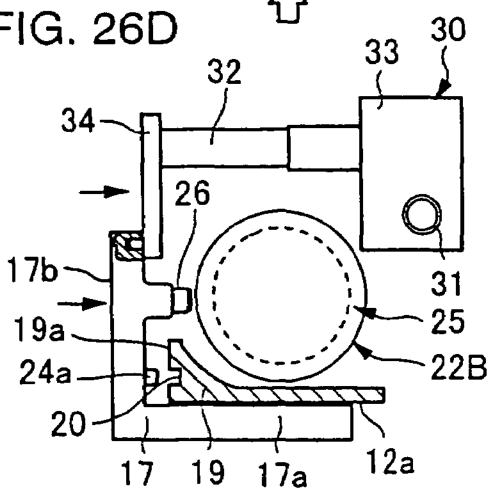
Figure 27:
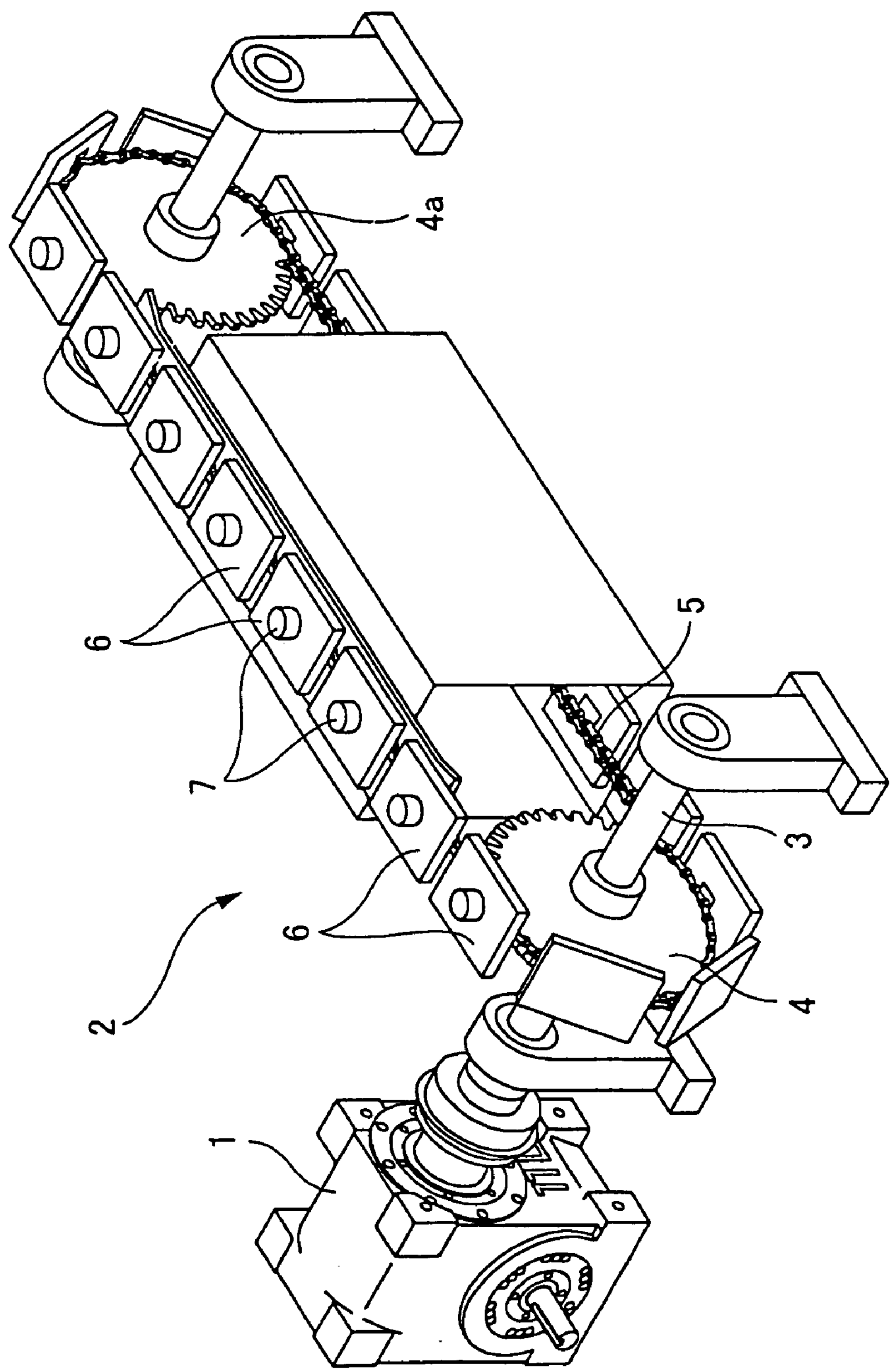
FIG. 27 is an overall perspective view showing one example of the conventional transporting apparatus.
Figure 28:
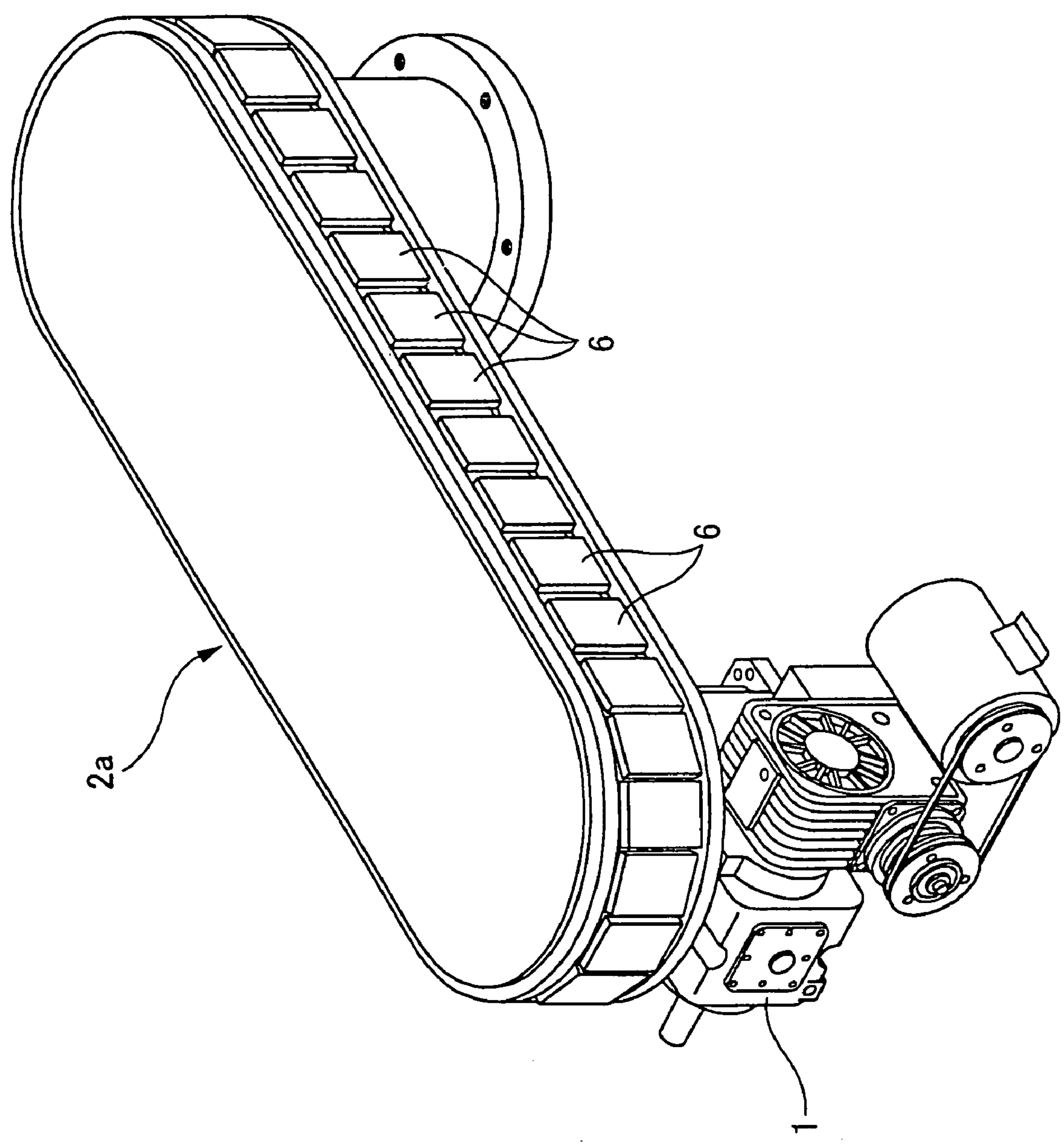
FIG. 28 is an overall perspective view showing another example of the conventional transporting apparatus.

With the construction set forth above, by extension of the output shaft of the cam arrangement 33 toward outside of the housing 12, the engaging pins 35 of the pivotal arm 34 are engaged with the engaging holes 36 of the work table 17 located to the terminal end of one of the linear transporting path 14A. Thus, the work table 17 is moved laterally to release engagement between the cam follower 26 and the cam groove 25 of the cylindrical cam 22A and engagement between the slider 24 and the guide groove 20 (FIGS. 26A to 26C). Then, by rotation of the output shaft 32 of the cam arrangement 33, the work table 17 is vertically turned or reversed and transferred to the transportation starting end of the other linear transporting path 14B (FIGS. 26C to 26D). Next, the output shaft 32 is contracted toward inside of the housing 12 for establishing engagement between the slider 24 and cam follower 26 on the back surface of the vertical strip portion 17*b* with the guide groove 20 and the cam groove 25. Thus, the work table 17 is transferred to the other linear transporting path 14B.

As set forth above, with the embodiments of the transporting apparatus according to the present invention, the following effects can be achieved:

Operation timings in stopping and moving of the work table on the linear transporting path depends on spiral shape (cam profile) provided on the peripheral surface of the cylindrical cam, and the spiral shape may be easily formed by arbitrarily setting the position and length of the stopping zones and gradients in the transporting zones adapting to the requirement of the operation to be performed in each work station. Accordingly, position or stopping period of the work station can be set appropriately per work station to achieve large freedom in setting.

Therefore, adapting to the work space required by each work implementing unit, such as robot or the like providing in each work station, interval between the work stations can be appropriately set to achieve improvement in space efficiency. On the other hand, adapting to long and short of the operation period, the stopping period in the work station can be easily set to avoid wasteful waiting period in the work station, in which operation can be completed within short period. Therefore, the transporting apparatus can be easily adapted for large number of kinds of works or products to improve general applicability and work efficiency.

It becomes possible to reduce lowering of dimensional accuracy due to accumulation of machining tolerance in comparison with conventional transporting apparatus employing the chain to improve motion accuracy and positioning accuracy of the work table. Furthermore, in comparison with the combination of chain and sprocket, wearing can be reduced to restrict increasing of error due to secular change resulting from wearing. Even in this point, degradation of motion accuracy and positioning accuracy can be suppressed.

For the linear transporting mechanism linearly transporting the work table engaged with the guide means of the transporting path formed in linear shape along the guide means by the cylindrical cam, the pivotal transporting mechanism having the pivotal arm mounted on the output shaft performing expanding and contracting operation in axial direction and rotating operation about the axis for engaging and disengaging the pivotal arm with and from the work table and turning the work table engaging with the pivotal arm, is arranged for transferring the table between the pivotal transporting mechanism and the linear transporting mechanism by synchronously operating the pivotal transporting mechanism and the cylindrical cam of the linear transporting mechanism. Therefore, the work can be transferred together with the work table between one step and the next step which can use the common work table with one step to permit construction of the compact pivotal transporting mechanism.

In accordance with the present embodiments, since both of the linear transporting mechanisms and the pivotal transporting mechanism are constructed with cam mechanisms and not employ a chain to reduce lowering of dimensional accuracy due to accumulation of machining tolerance in comparison with conventional transporting apparatus employing the chain to improve motion accuracy and positioning accuracy of the work table. Furthermore, in comparison with the combination of chain and sprocket, wearing can be reduced to restrict increasing of error due to secular change resulting from wearing. Even in this point, degradation of motion accuracy and positioning accuracy can be suppressed.

By vertically lifting the output shaft of the pivotal transporting mechanism in synchronism with stopping period of the cam, portion formed at the transportation terminating end and the transportation starting end of the cylindrical cam, the work table can be easily transferred between the linear transporting mechanism and the pivotal transporting mechanism at the transportation terminating end and the transportation starting end. Accordingly, only by arranging the output shaft of the cam arrangement, in which the output shaft performing rotating operation and lifting operation in the axial direction, at a position equally distanced to the transportation terminating end and the transportation starting end of two linear transporting mechanisms and pivotably mounting the pivotal arm on the output shaft for engaging and disengaging with the work table, it becomes possible to simply construct the pivotal transporting mechanism for pivotally transferring the work table from the transportation terminating end of one linear transporting mechanism to the transportation starting end of the other linear transporting mechanism.

The cylindrical cam of the linear transporting mechanism for linearly transporting the work table along the linear transporting path is divided into the upstream side cylindrical cam fraction and the downstream side cylindrical cam fraction arranged in alignment with each other. Transfer of the work table between the upstream side cylindrical cam fraction and the downstream side cylindrical cam fraction is performed by means of transferring means, such as sprocket. The transferring means and upstream and downstream side cylindrical cam fractions are driven for synchronous rotation at the center in the axial direction by the rotational torque transmitting mechanism. Therefore, in comparison with the case where single cylindrical cam is provided over the entire lengths of the linear transporting paths to rotating drive the same at the axial end, the lengths of respective of upstream and downstream side cylindrical cam fractions becomes substantially half. Therefore, formation of the cylindrical cam fractions can be facilitated. Furthermore, torsional deformation magnitude to be caused at the axial end associating with transmission of rotation driving torque becomes half to reduce possibility of occurrence of error resulting from deformation. In other words, it becomes possible to extend the length of the linear transporting paths to be about double to permit arrangement of work stations with high space efficiency. In addition, since the worktable is linearly transferred on the linear transporting paths by the sprocket in discontinuous portion of the cylindrical cams. Furthermore, it becomes unnecessary to shift the timing (phase) between the upstream side cylindrical cam fractions and the downstream side cylindrical cam fractions.

With taking one linear transporting path of the linear transporting mechanism and one curved transporting path of the pivotal transporting mechanism, as minimum unit, and by combining one or more minimum units, various configurations of transporting paths can be formed.

In addition, by providing two or more linear transporting paths and the corresponding number of curved transporting paths, the circulating transporting path for circulating the work table can be formed into any desired polygonal shape. Furthermore, by placing a plurality of linear transporting paths with placing the transportation terminating end and the transportation starting end in close proximity with each other with a predetermined angle and by connecting adjacent the transportation terminating end and the transportation starting end by the pivotal transporting mechanism, various configuration, such as meandering shape, can be easily formed.

Although the present invention has been illustrated and described with respect to exemplary embodiment thereof, it should be understood by those skilled in the art that the foregoing and various other changes, omission and additions may be made therein and thereto, without departing from the spirit and scope of the present invention. Therefore, the present invention should not be understood as limited to the specific embodiment set out above but to include all possible embodiments which can be embodied within a scope encompassed and equivalent thereof with respect to the feature set out in the appended claims.

What is claimed is:

1. A transporting apparatus comprising:

a linear transporting mechanism driving a work table engaging with guide means of a transporting path formed into linear shape along said guide means by means of a cylindrical cam; and a pivotal transporting mechanism having a pivotal arm mounted on an output shaft which performs extracting and retracting motion in axial direction and rotating motion about an axis, said pivotal arm being engaged and disengaged to and from said work table according to extracting and retracting motion of said output shaft, and pivotally transporting said work table engaging with said pivotal arm according to rotating motion of said output shaft, said pivotal transporting mechanism being provided at a transportation terminating end or a transportation starting end of said linear transporting mechanism and being actuated in synchronism with said cylindrical cam of said linear transporting mechanism for transferring said work table between said pivotal transporting mechanism and said linear transporting mechanism.

2. A transporting apparatus comprising:

a plurality of linear transporting mechanism, each including a linear transporting path extending linearly across a plurality of work stations and having guide means releasably engaging with a work table for guiding the latter for linear motion;

a cylindrical cam provided along said linear transporting path and releasably engaging with a cam follower extended from said work table in the same direction as engaging and disengaging direction of said guide means for driving said work table to move linearly, said cylindrical cam defining a stopping zones corresponding to a transportation terminating end, a transportation starting end and each work station and having no axial displacement relative to cam rotational angle and transporting zones located at positions between said work stations and having axial displacement relative to cam rotational angle;

each of said linear transporting mechanisms having transportation terminating end and transportation starting end, said linear transporting mechanisms being sequentially arranged with placing said transportation terminating end of one linear transporting mechanism in close proximity with said transportation starting end of the other linear transporting mechanism with a predetermined angle;

a pivotal transporting mechanism each located between said adjacent transportation terminating end of one linear transporting mechanism and transportation starting end of the other linear transporting mechanism having an output shaft located with equal distance to said adjacent transportation terminating end and transportation starting end, having a pivotal arm mounted on said output shaft for engaging with said work table stopped at said transportation terminating end of one linear transporting mechanism by extracting motion of said output shaft in axial direction and transferring said work table to said transportation starting end of the other linear transporting mechanism by rotational motion of said output shaft, and disengaging from said work table by retracting motion of said output shaft, said plurality of linear transporting mechanism and said pivotal transporting mechanism being operated in synchronism with each other.

3. A transporting apparatus as set forth in claim 1 or 2, wherein said linear transporting path is constructed with a support base integrally formed with an apparatus housing and slidably mounting said work table and a guide member provided on said support base in linear shape, and said work table is provided with a slider engaging with said guide member and permitting linear movement of said work table with restricting pivotal motion thereof.

4. A transporting apparatus as set forth in claim 1 or 2, wherein at least two linear transporting mechanisms and corresponding number of pivotal transporting mechanisms are provided for forming an endless circulating transporting path.

* * * * *